United States Patent
Zuckerman

(10) Patent No.: US 7,809,517 B1
(45) Date of Patent: Oct. 5, 2010

(54) APPARATUS AND METHOD FOR MEASURING PHASE NOISE/JITTER IN DEVICES UNDER TEST

(75) Inventor: Lawrence H. Zuckerman, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 433 days.

(21) Appl. No.: 11/899,849

(22) Filed: Sep. 7, 2007

(51) Int. Cl.
*G06F 19/00* (2006.01)
(52) U.S. Cl. .......................... 702/72; 324/537; 702/187
(58) Field of Classification Search .............. 73/432.1, 73/865.8, 865.9, 866.5; 324/73.1, 76.11, 324/76.77, 158.1, 500, 509, 511, 512, 521, 324/527, 537, 754, 765; 327/1, 2, 3; 340/500, 340/540, 635, 653, 657, 658; 702/1, 57, 702/58, 66, 70, 72, 79, 108, 109, 117, 124, 702/126, 127, 187, 189
See application file for complete search history.

(56) References Cited

U.S. PATENT DOCUMENTS

| | | | | |
|---|---|---|---|---|
| 2,950,437 | A | * | 8/1960 | Stahl .......................... 324/73.1 |
| 2,952,810 | A | * | 9/1960 | Helton ........................ 324/537 |
| 2,996,666 | A | * | 8/1961 | Baker ......................... 324/73.1 |
| 3,082,374 | A | * | 3/1963 | Buuck ........................ 324/73.1 |
| 3,219,927 | A | * | 11/1965 | Topp, Jr. et al. ............. 714/735 |
| 3,237,100 | A | * | 2/1966 | Chalfin et al. ................ 324/108 |
| 3,319,166 | A | * | 5/1967 | Coleman ..................... 324/754 |
| 3,487,304 | A | * | 12/1969 | Kennedy .................... 324/73.1 |
| 3,492,572 | A | * | 1/1970 | Jones et al. .................. 714/740 |
| 3,522,532 | A | * | 8/1970 | McCoy ....................... 324/73.1 |
| 3,541,441 | A | * | 11/1970 | Hrustich ..................... 324/73.1 |
| 3,976,940 | A | * | 8/1976 | Chau et al. .................. 714/736 |
| 4,092,589 | A | * | 5/1978 | Chau et al. .................. 714/736 |
| RE31,056 | E | * | 10/1982 | Chau et al. .................. 714/700 |
| 4,596,026 | A | | 6/1986 | Cease et al. |
| 4,975,596 | A | | 12/1990 | Thomas et al. |
| 5,404,577 | A | | 4/1995 | Zuckerman et al. |
| 5,802,463 | A | | 9/1998 | Zuckerman |
| 5,835,501 | A | | 11/1998 | Dalmia et al. |
| 6,169,912 | B1 | | 1/2001 | Zuckerman |
| 6,259,666 | B1 | | 7/2001 | Kobayashi et al. |
| 6,301,190 | B1 | | 10/2001 | Tsujino et al. |

(Continued)

OTHER PUBLICATIONS

Ulrich L. Rohde et al., "Communications Receivers: Principles and Design", Frequency Control and Local Oscillators, McGraw-Hill, Second Edition, 5 pages.

(Continued)

*Primary Examiner*—Edward R Cosimano

(57) ABSTRACT

A system for testing integrated circuit products and other devices under test (DUT) includes a DUT tester, which stimulates the devices under test and analyzes signals from the devices under test. A device interface board transports signals between the DUT tester and the devices under test. A test board is coupled to the device interface board and used to generate measurements associated with the devices under test, such as phase noise or phase jitter measurements. The test board could, for example, include a phase detector for detecting a phase difference between two signals and a control loop for adjusting at least one of the two signals to maintain an average of zero DC volts at an output of the phase detector. A customization module could also be used to customize the test board. The customization module could include a phase shifter, a phase-locked loop synthesizer, and/or an oscillator.

20 Claims, 31 Drawing Sheets

U.S. PATENT DOCUMENTS

| | | | |
|---|---|---|---|
| 6,484,280 | B1 | 11/2002 | Moberly |
| 6,586,924 | B1* | 7/2003 | Okayasu et al. ........... 324/158.1 |
| 6,747,469 | B2* | 6/2004 | Rutten ........................ 324/765 |
| 6,882,139 | B2* | 4/2005 | Grebner et al. ........... 324/158.1 |
| 7,035,324 | B2* | 4/2006 | Mar et al. .................... 375/224 |
| 7,096,139 | B2* | 8/2006 | Miyazaki et al. ............ 702/117 |
| 7,113,749 | B2 | 9/2006 | Smith et al. |
| 7,190,155 | B2* | 3/2007 | Washizu .................. 324/76.77 |
| 7,193,407 | B2* | 3/2007 | Washizu .................. 324/76.77 |
| 7,237,167 | B2* | 6/2007 | Inaba et al. ................. 714/740 |
| 7,275,197 | B2* | 9/2007 | Inaba et al. ................. 714/740 |
| 7,543,202 | B2* | 6/2009 | Matsubara et al. .......... 714/700 |
| 7,574,633 | B2* | 8/2009 | Sato et al. ................... 714/700 |
| 2003/0020488 | A1* | 1/2003 | Grebner et al. .............. 324/601 |
| 2003/0031241 | A1* | 2/2003 | Mar et al. .................... 375/224 |
| 2003/0085726 | A1* | 5/2003 | Rutten ........................ 324/765 |
| 2003/0175037 | A1 | 9/2003 | Kimmitt et al. |
| 2005/0182583 | A1* | 8/2005 | Miyazaki et al. ............ 702/117 |
| 2005/0193298 | A1* | 9/2005 | Inaba et al. ................. 714/726 |
| 2005/0240852 | A1* | 10/2005 | Inaba et al. ................. 714/740 |
| 2007/0035288 | A1* | 2/2007 | Washizu .................. 324/76.52 |
| 2007/0035289 | A1* | 2/2007 | Washizu .................. 324/76.77 |
| 2007/0052427 | A1* | 3/2007 | Washizu ..................... 324/622 |
| 2007/0250743 | A1* | 10/2007 | Matsubara et al. .......... 714/712 |
| 2008/0012576 | A1* | 1/2008 | Sato et al. ................... 324/617 |

OTHER PUBLICATIONS

L. Schiano et al., "Measuring the Timing Jitter of ATE in the Frequency Domain", Jun. 29, 2004, pp. 1-16.

"Jitter Measurements for CLK Generators or Synthesizers", Dallas Semiconductor, Sep. 26, 2003, 6 pages.

Un-Ku Moon et al., "Spectral Analysis of Time-Domain Phase Jitter Measurements", IEEE Transactions on Circuits and Systems-II: Analog and Digital Signal Processing, vol. 49, No. 5, May 2002, pp. 321-327.

"Phase Noise Measurements, Convert Time Interval Error Into Phase Noise", LeCroy Application Brief No. LAB 744, 4 pages.

M. Takamiya et al., "On-Chip Jitter-Spectrum Analyzer for High-Speed Digital Designs", NEC, 27 pages.

Joseph V. Adler, "Clock-source jitter: A clear understanding aids oscillator selection", www.ednmag.com, Feb. 18, 1999, pp. 79-86.

Neil Roberts, "Phase noise and jitter—a primer for digital designers", EEdesign.com, Jul. 14, 2003, 7 pages.

Algie L. Lance et al., "Phase Noise and AM Noise Measurements in the Frequency Domain", Infrared and Millimeter Waves, vol. 11, 1984, pp. 239-289.

Warren F. Walls, "Practical Problems Involving Phase Noise Measurements", 33rd Annual Precise Time and Time Interval (PTTI) Meeting, pp. 407-416.

Morris Smith, "Phase Noise Measurement Using the Phase Lock Technique", Motorola, Inc., 1999, 12 pages.

Warren F. Walls, "Cross-Correlation Phase Noise Measurements", 1992 IEEE Frequency Control Symposium, pp. 257-261.

D.B. Sullivan et al., "Characterization of Clocks and Oscillators", 13 pages.

"Advanced Phase Noise and Transient Measurement Techniques", Agilent Technologies, Oct. 5, 2004, 8 pages.

"PN9000 Automated Phase Noise Measurement System Application Note #2", Aeroflex, 2003, 20 pages.

"Jitter in Clock Sources", Vectron International, May 23, 2005, 9 pages.

Pankaj Goyal, "Theory and Practical Considerations for Measuring Phase Noise Better Than-165 dBc/Hz: Part I", Microwave Journal, Oct., Nov. 2004, 29 pages.

"Measurement of Frequency Stability and Phase Noise", Aeroflex, Aug. 2005, 8 pages.

Stephen Sunter, et al., "An Automated, Complete, Structural Test Solution for SERDES", ITC International Test Conference, 2004 IEEE, p. 95-104.

Dongwoo Hong, et al., "An Efficient Random Jitter Measurement Technique Using Fast Comparator Sampling", Proceedings of the 23rd IEEE VLSI Test Symposium (VTS'05), 8 pages.

Stephen Sunter, et al., "On-Chip Digital Jitter Measurement, from Megahertz to Gigahertz", IEEE Design & Test Computers, 2004 IEEE, p. 314-321.

Simon Bikulcius, et al., "Apparatus and Method for Testing High-Speed Serial Transmitters and Other Devices", U.S. Appl. No. 11/803,231 filed May 14, 2007.

* cited by examiner

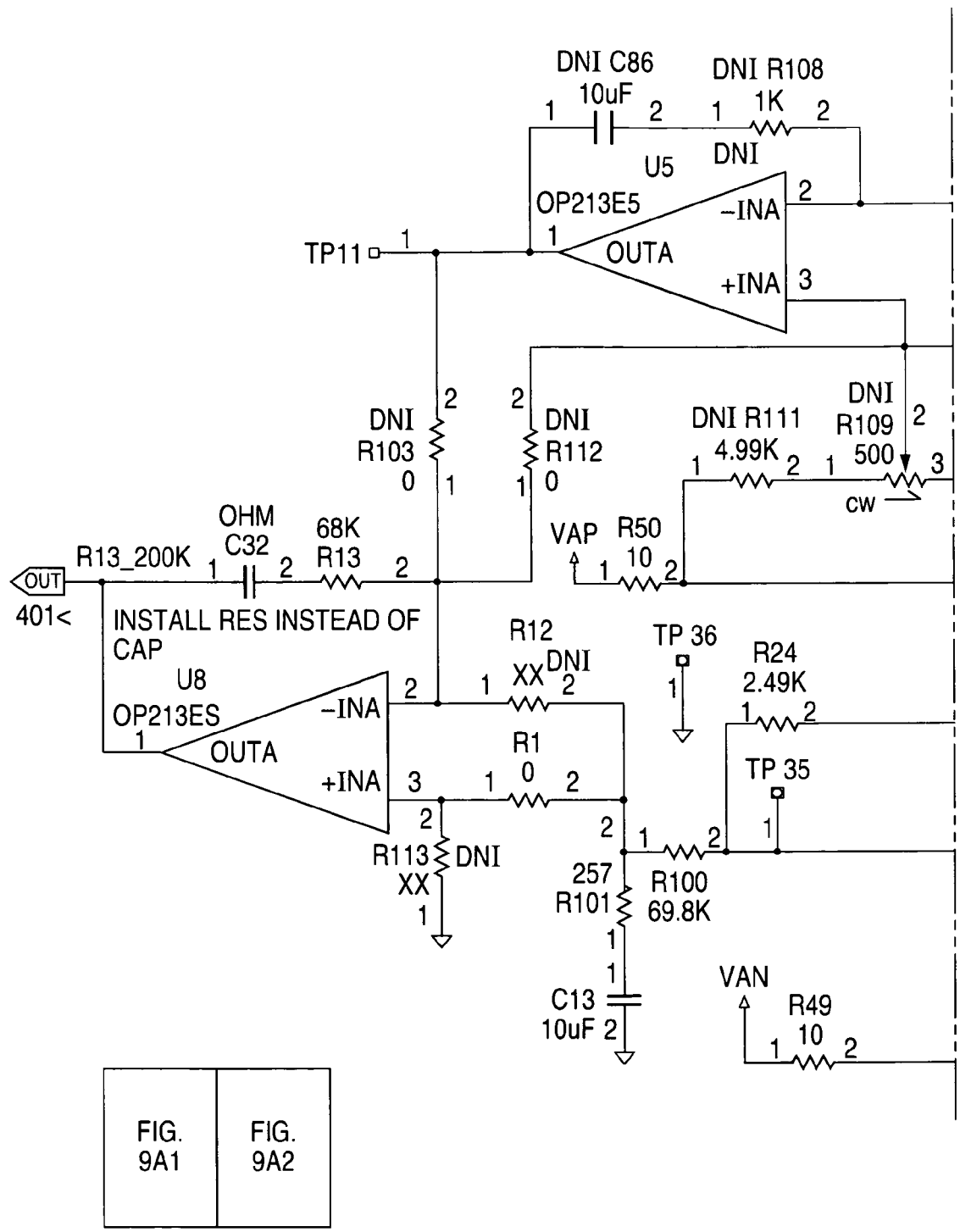
FIG. 9A1

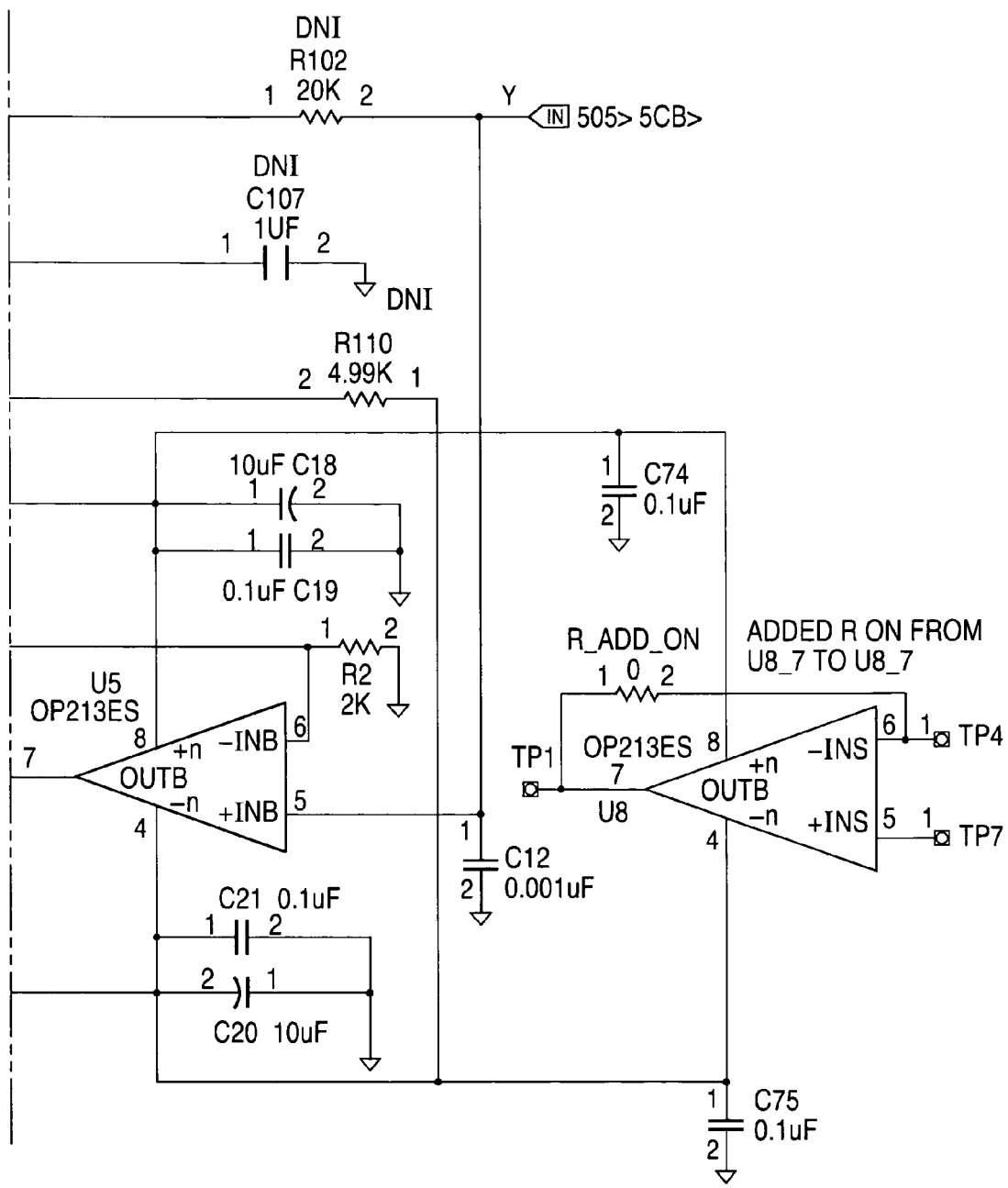
FIG. 9A2

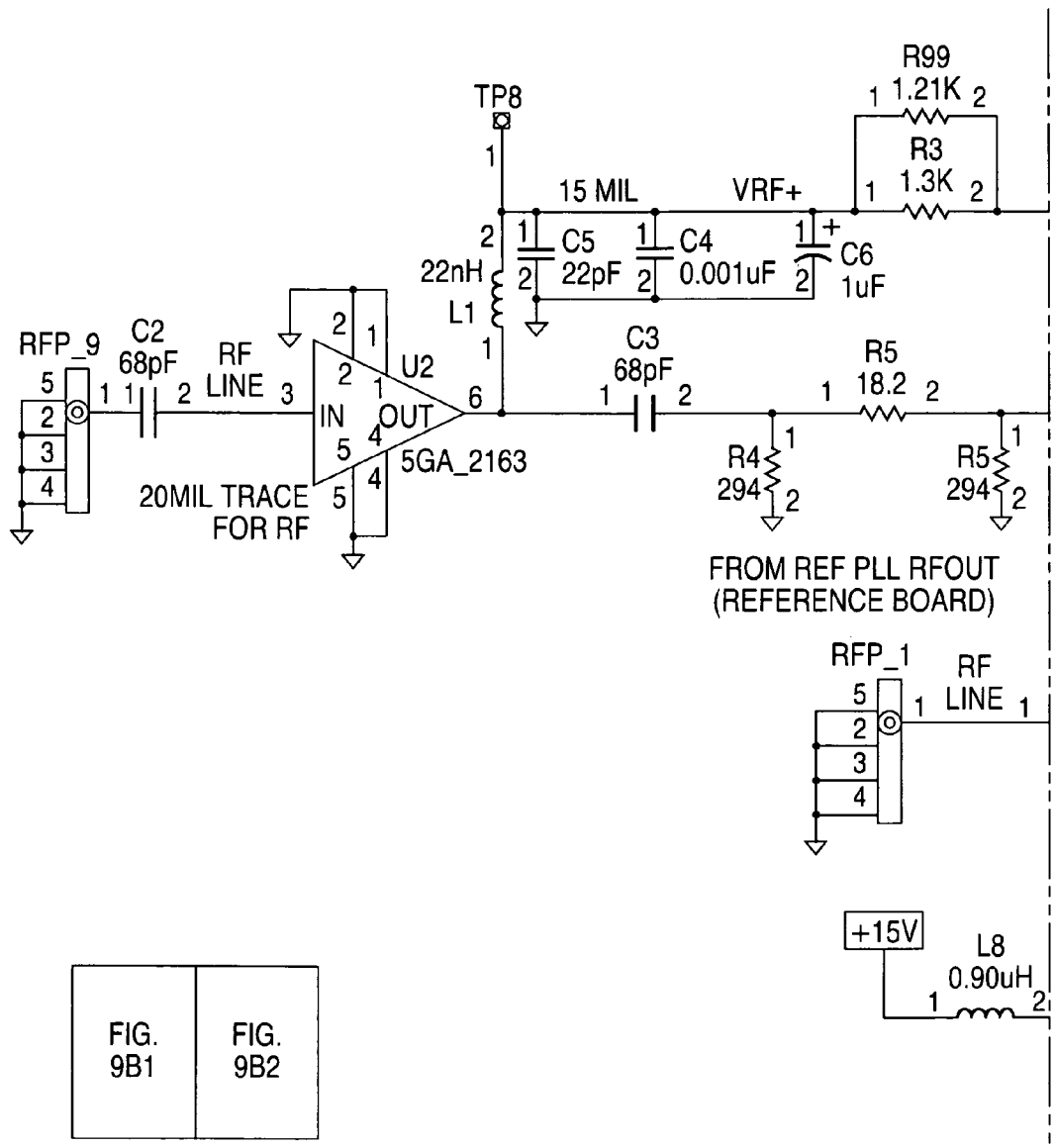
FIG. 9B1

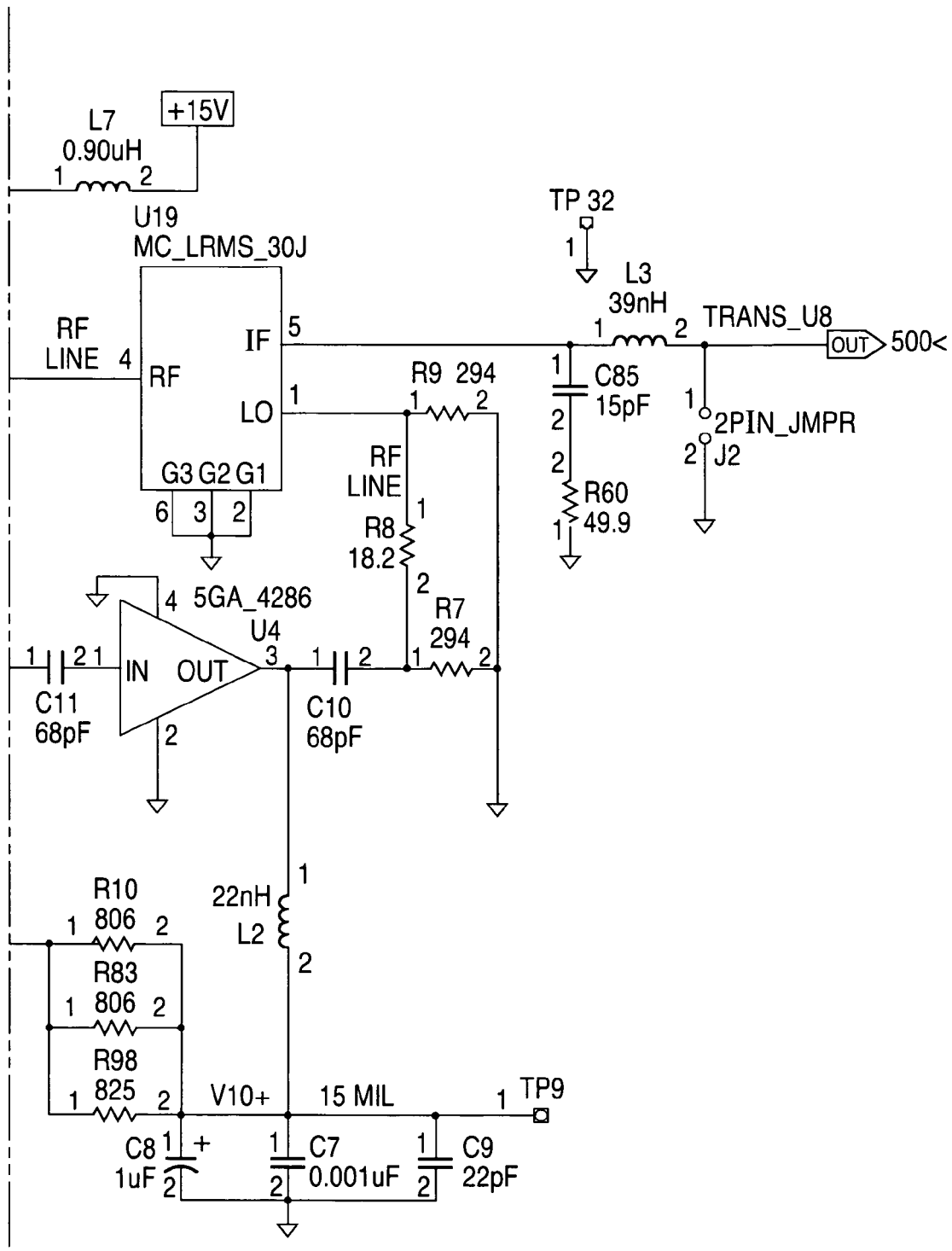
FIG. 9B2

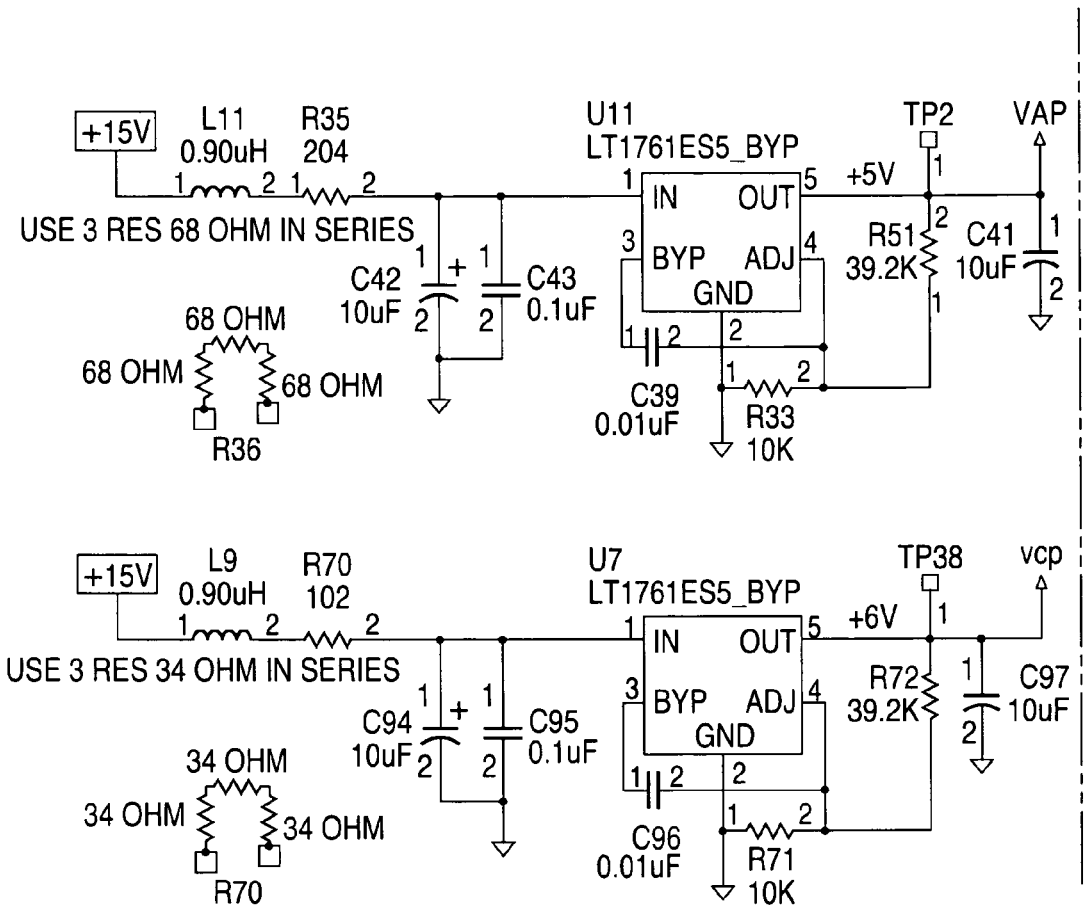
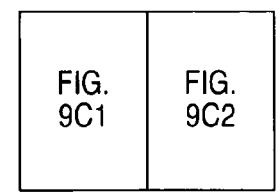
FIG. 9C1

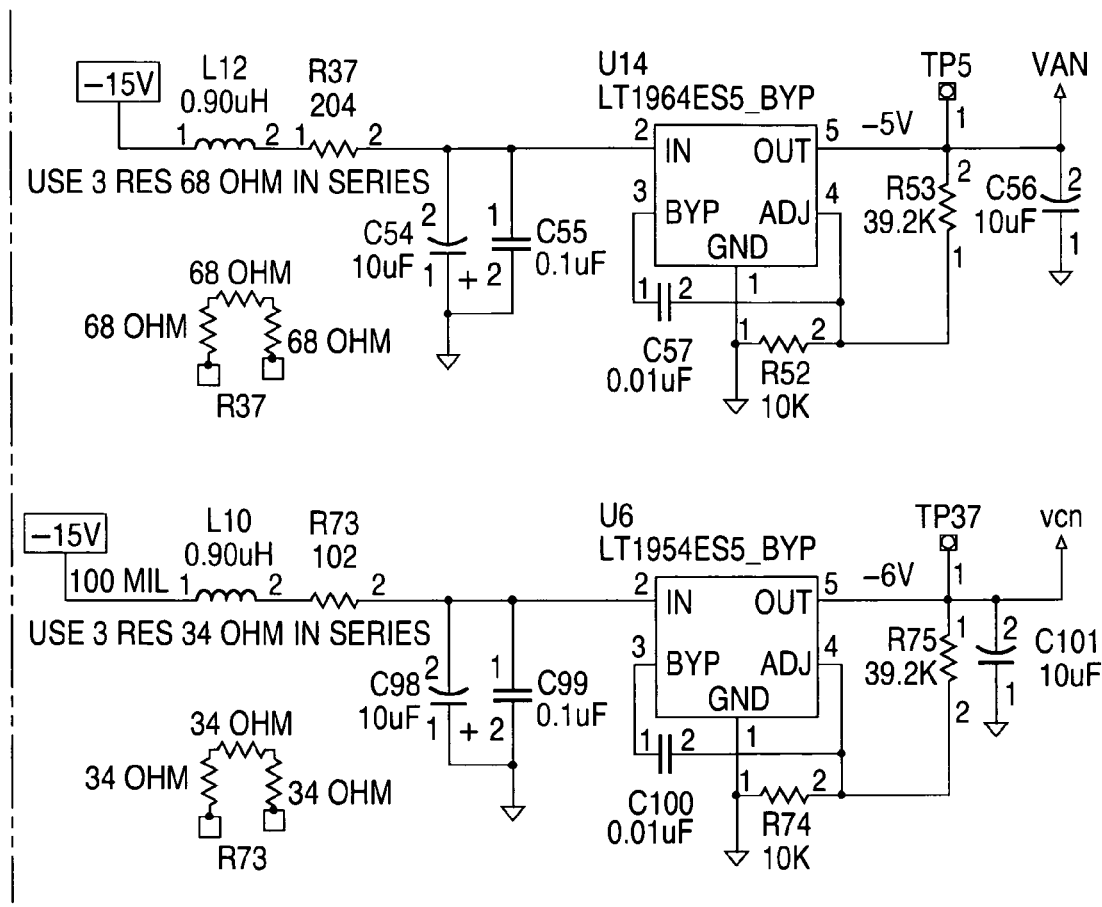
FIG. 9C2

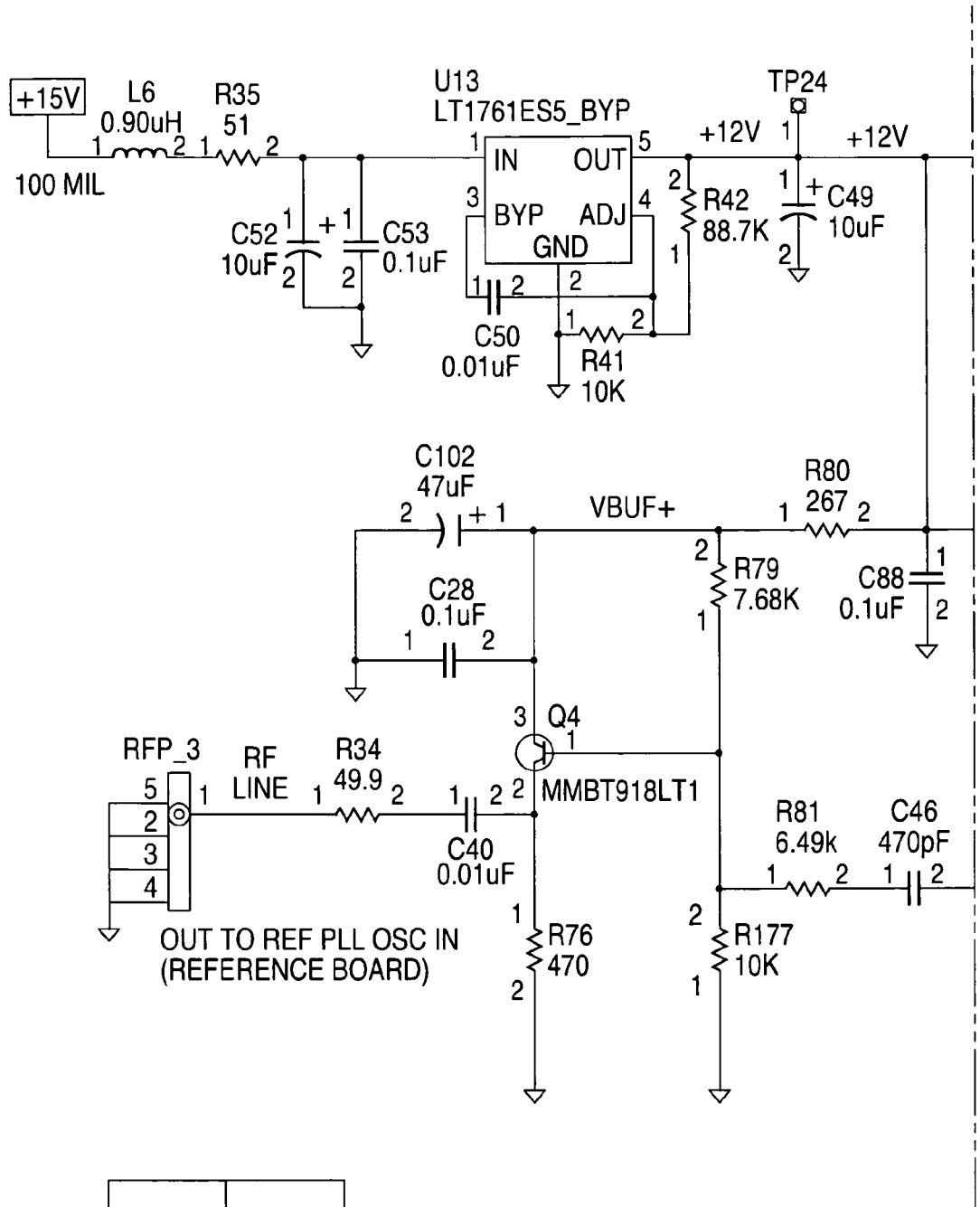
FIG. 9D1

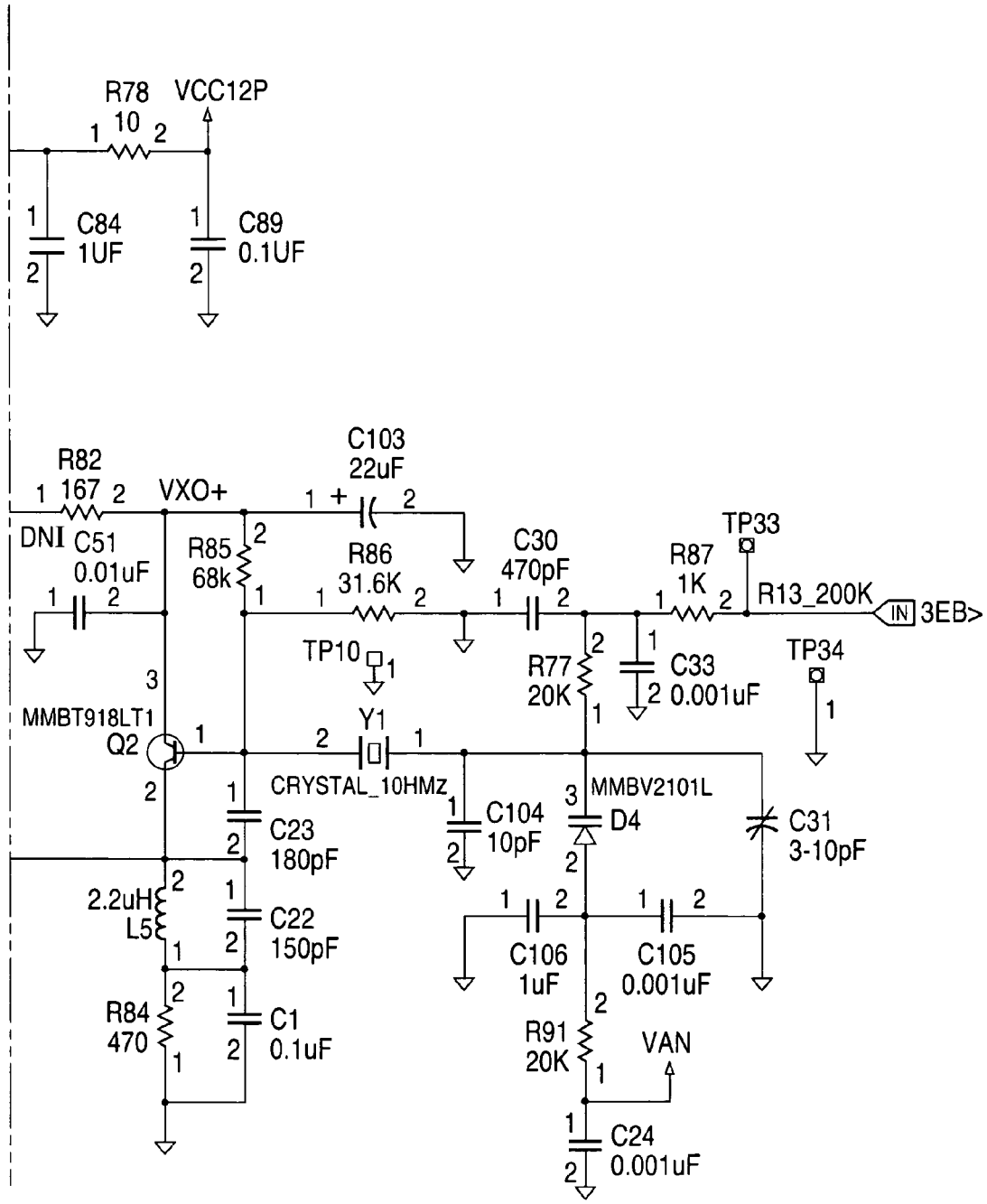
FIG. 9D2

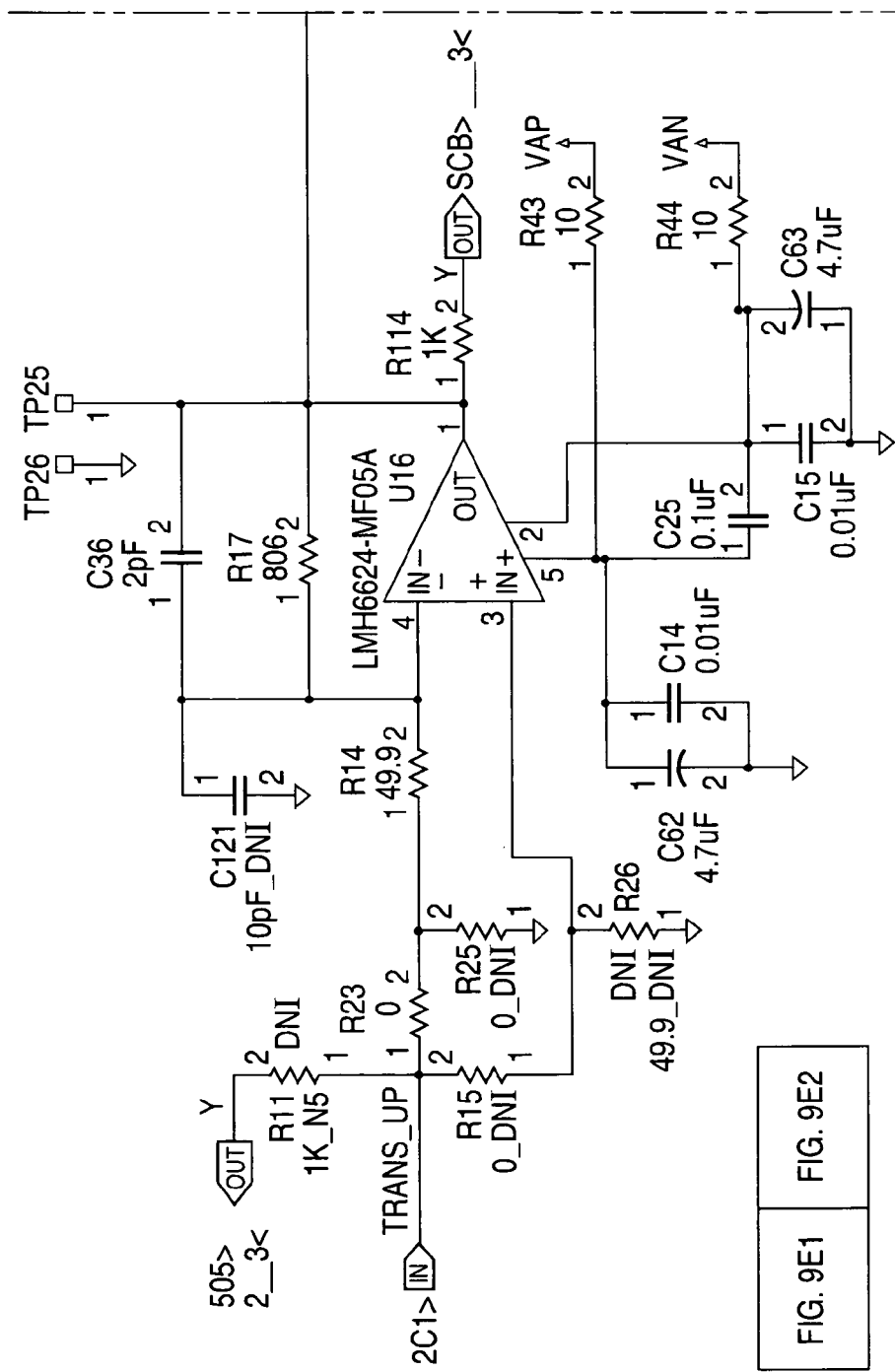
FIG. 9E1

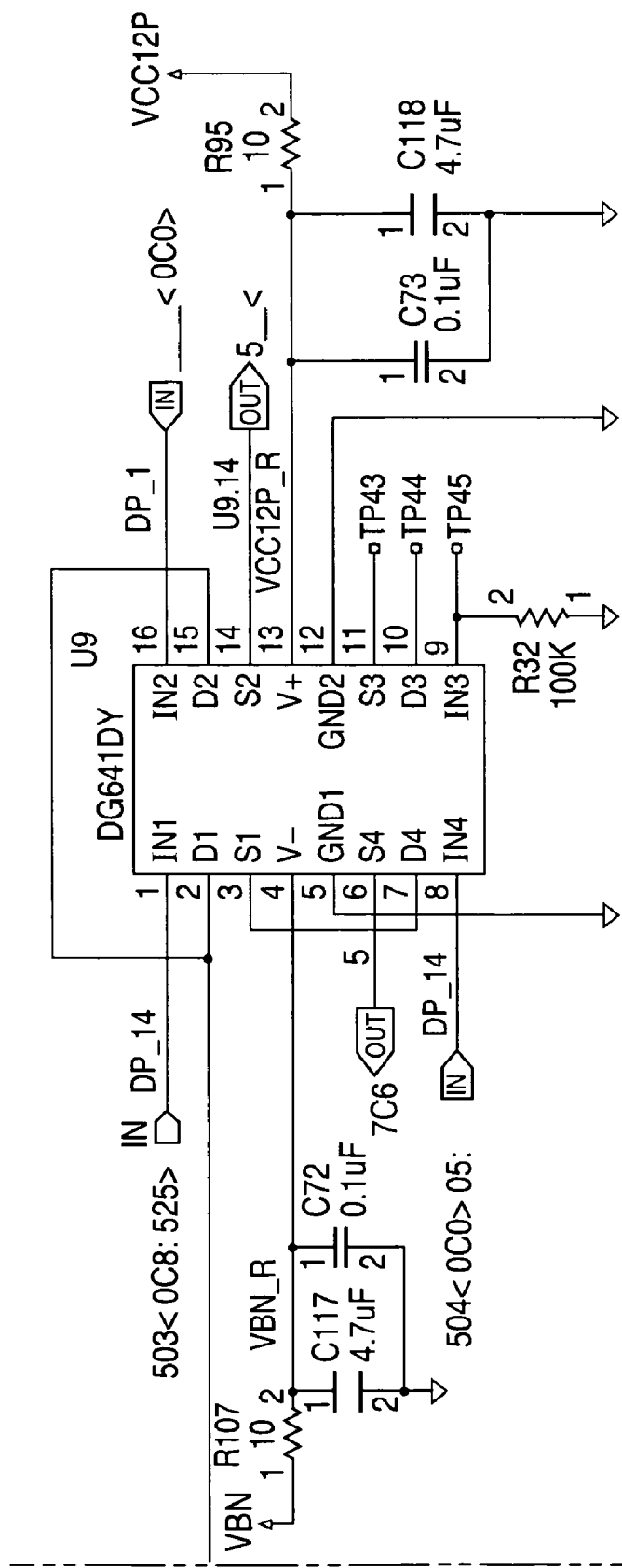
FIG. 9E2

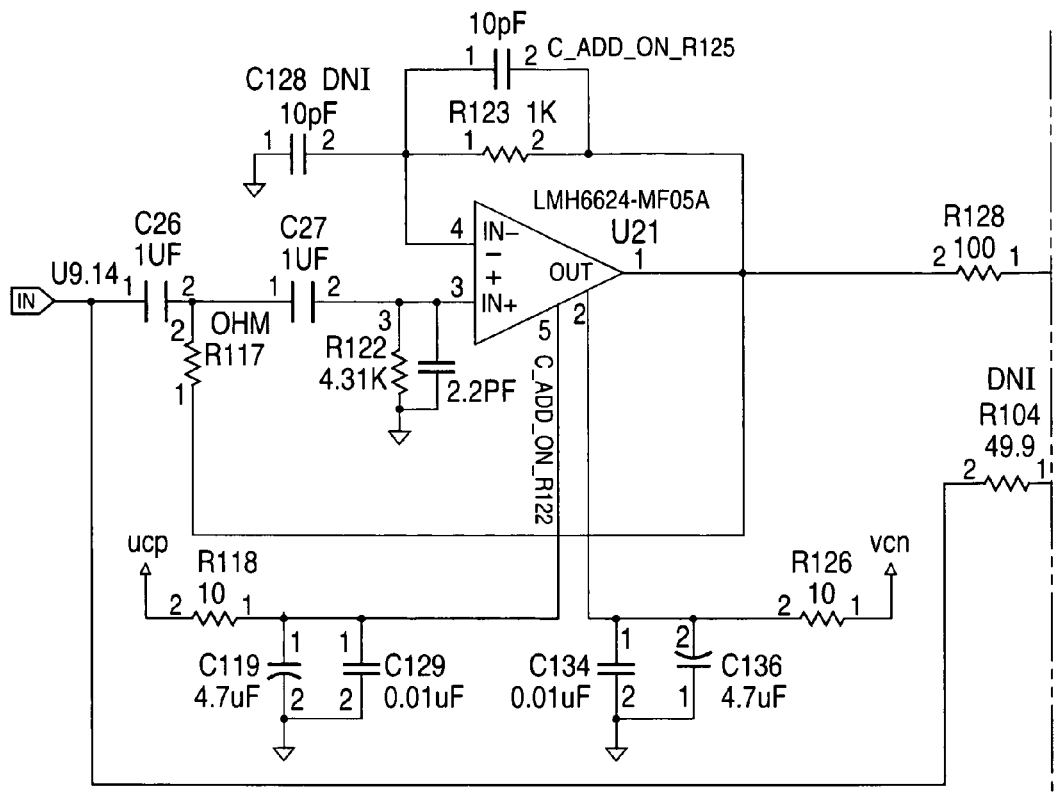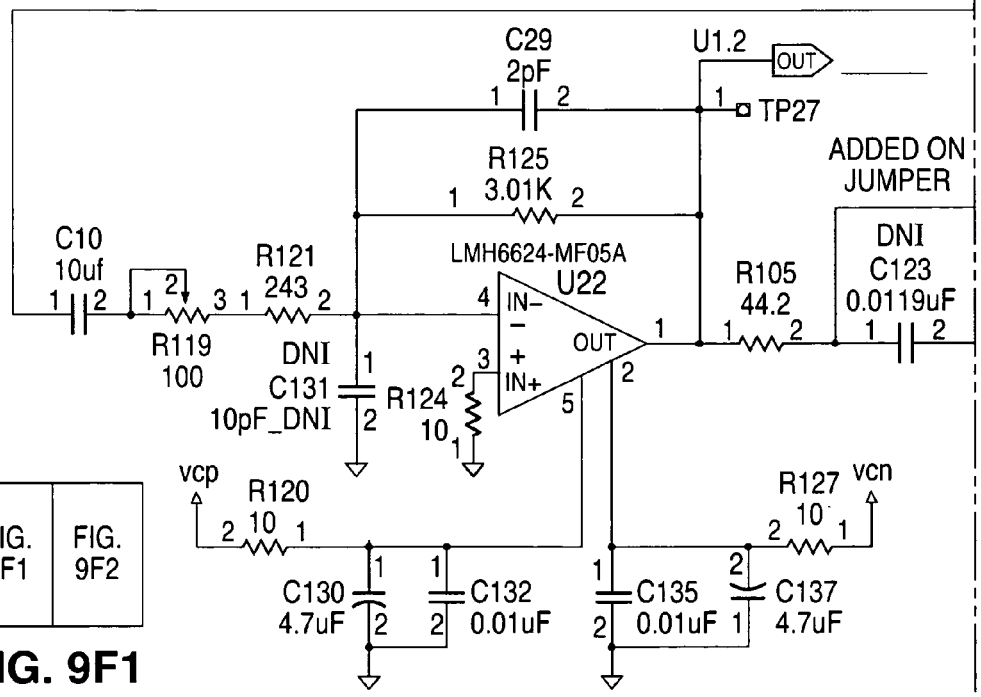
FIG. 9F1

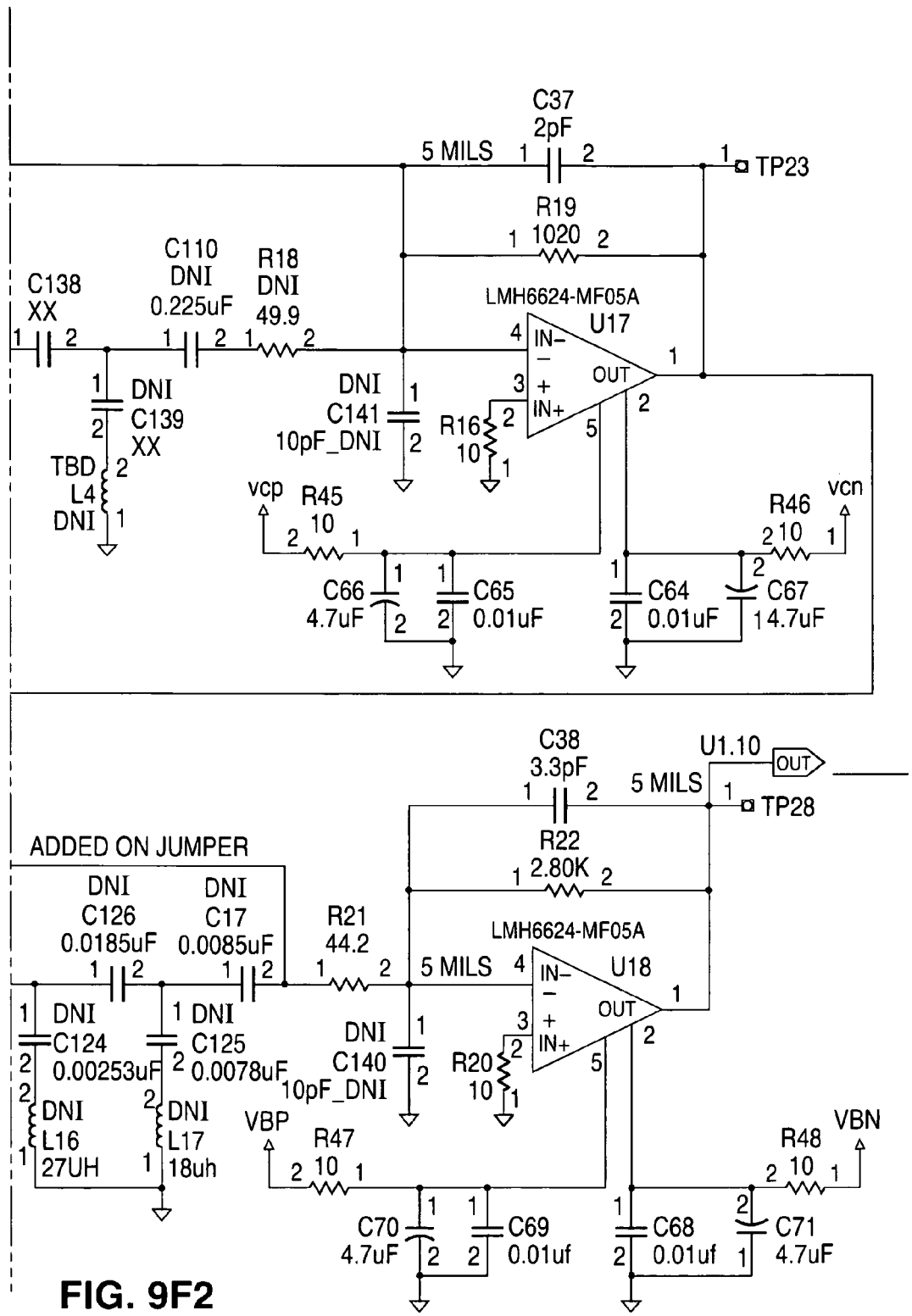
FIG. 9F2

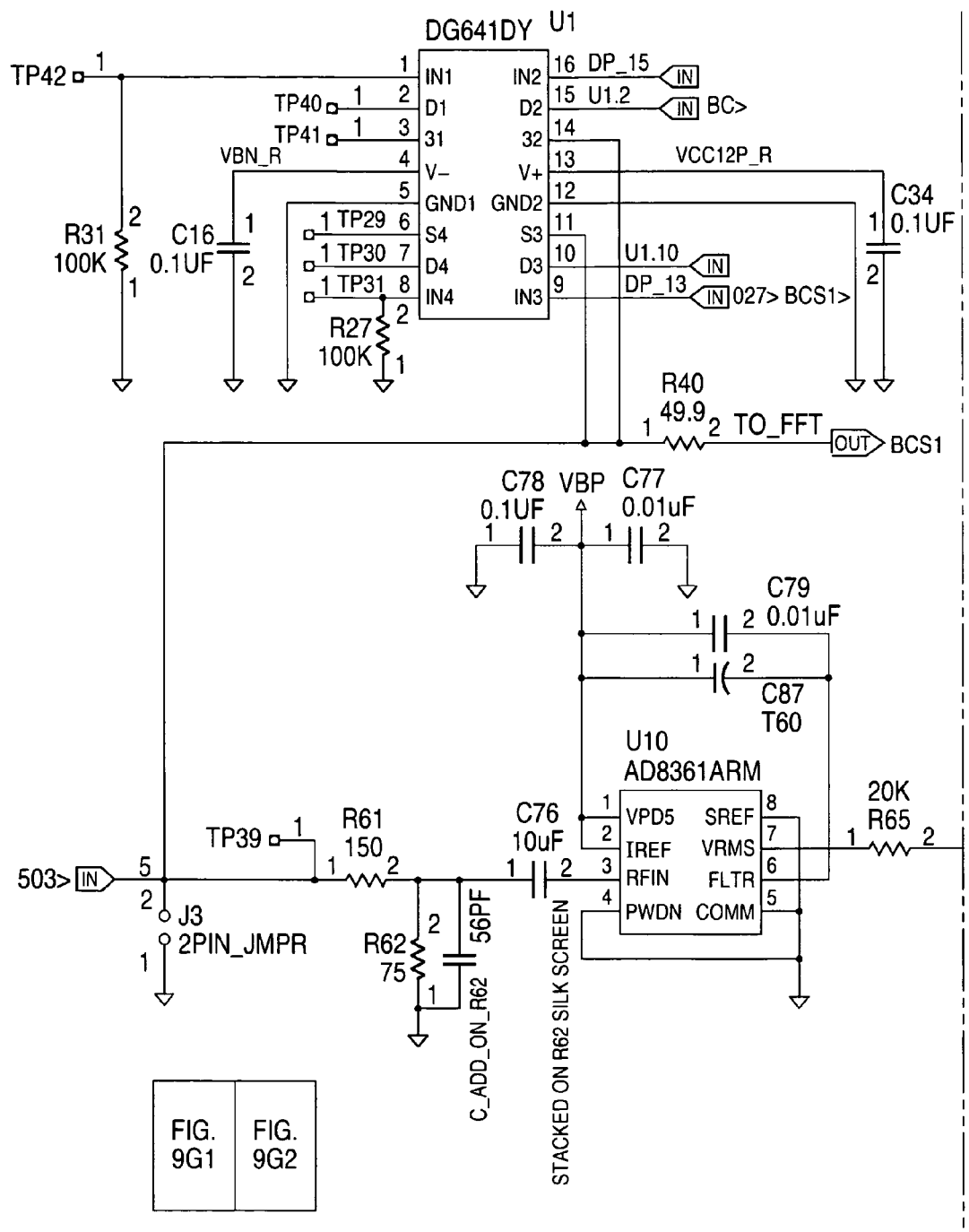
FIG. 9G1

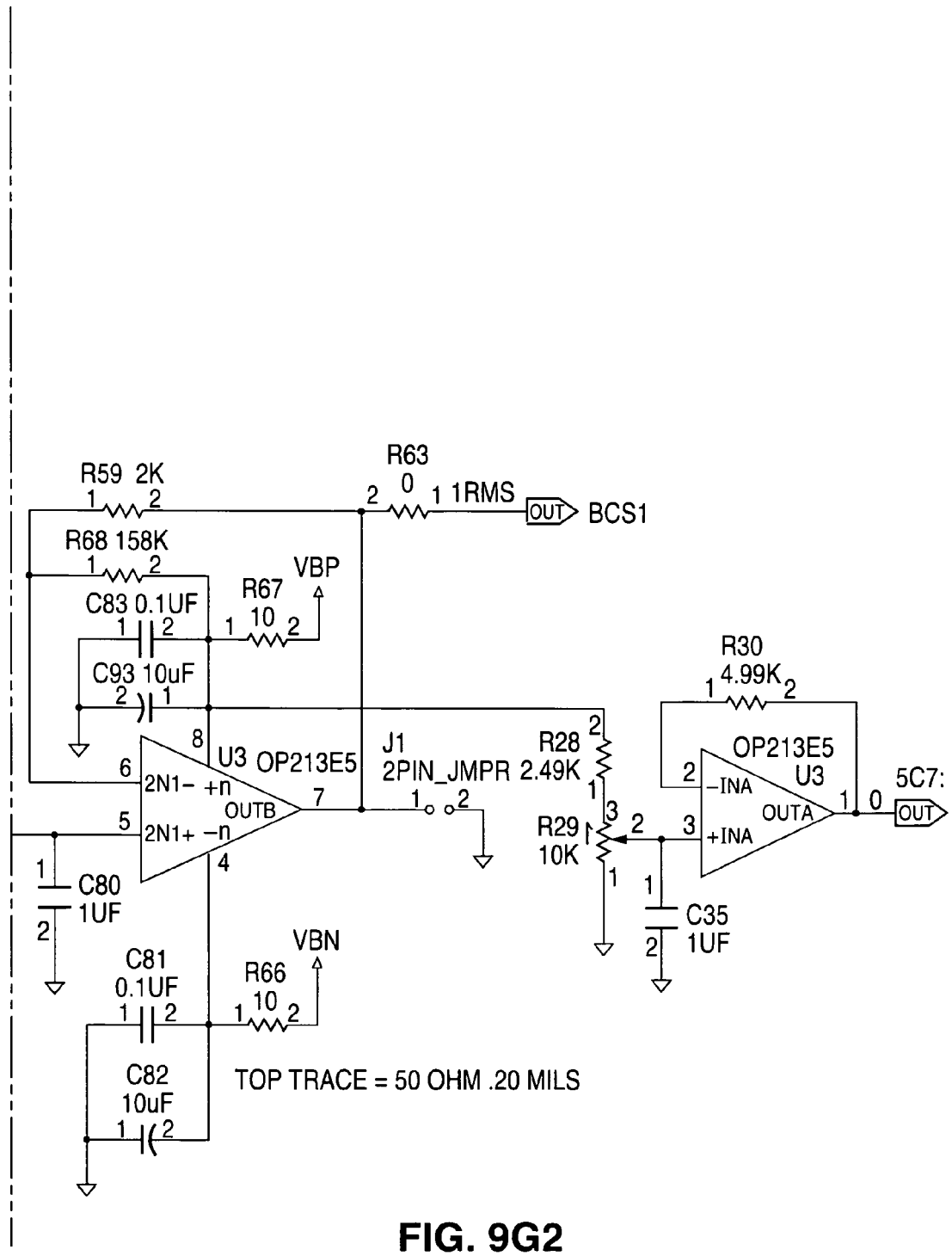
FIG. 9G2

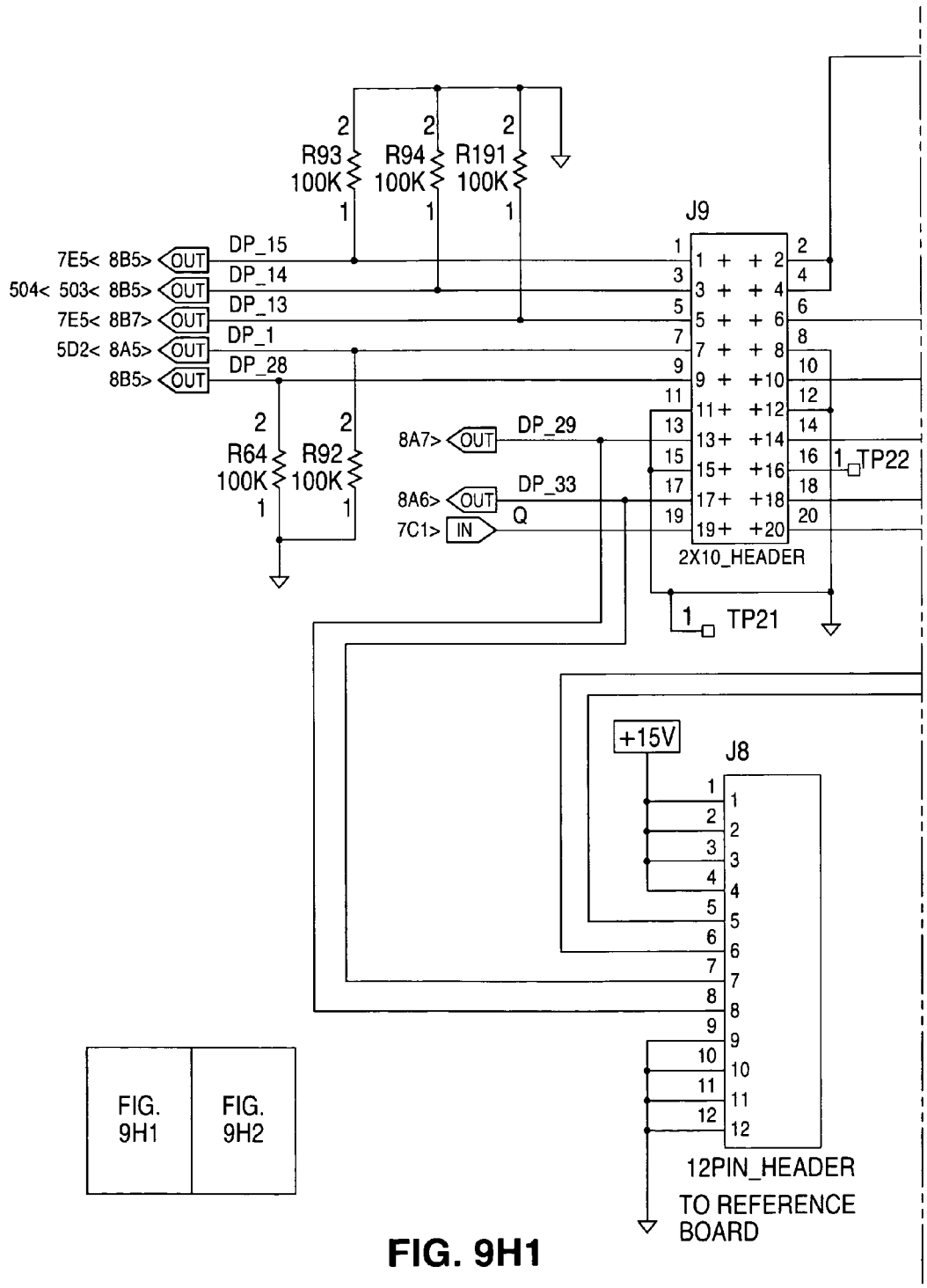
FIG. 9H1

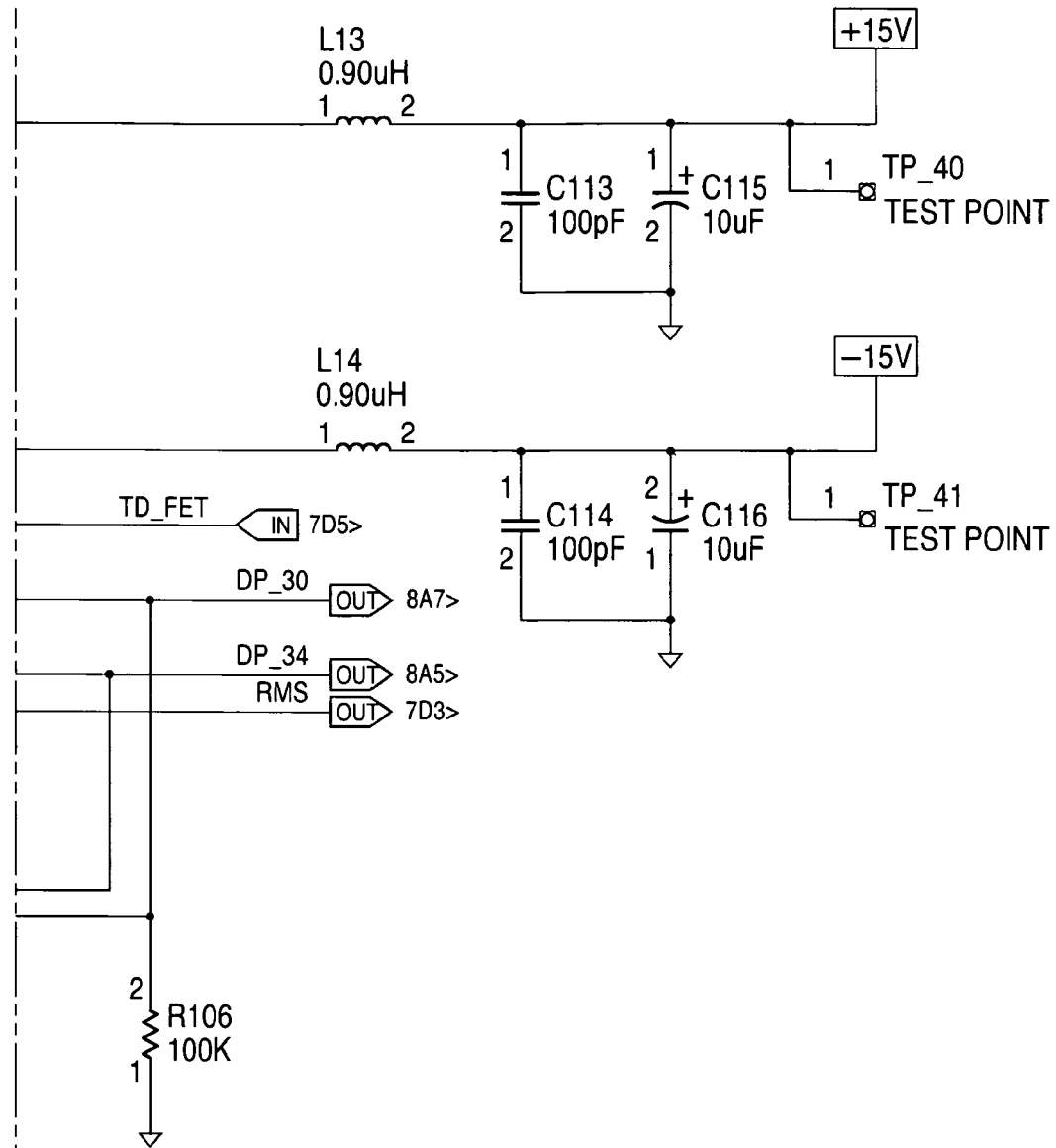
FIG. 9H2

APPARATUS AND METHOD FOR MEASURING PHASE NOISE/JITTER IN DEVICES UNDER TEST

TECHNICAL FIELD

This disclosure is generally directed to testing systems and more specifically to an apparatus and method for measuring phase noise/jitter in devices under test.

BACKGROUND

Semiconductor manufacturers, electronics companies, and other entities routinely produce large numbers of integrated circuit products. During the fabrication or manufacturing process, these entities almost always wish to test the integrated circuit products being produced. These tests are often performed to ensure proper operation of the integrated circuit products and to ensure that the integrated circuit products meet desired or required specifications.

The testing of integrated circuit products has become more and more difficult as the speed of the integrated circuit products have increased and as the testing has become more complex. Also, the testing of integrated circuit products often involves the use of extremely expensive testing equipment. While it is possible for manufacturers and other entities to test every single integrated circuit product being manufactured (such as by purchasing a large quantity of the extremely expensive testing equipment), this testing is still usually very slow. For example, it can often take several seconds to generate test measurements for a single integrated circuit product, and the test measurements may not be repeatable.

Because of these and other problems, manufacturers and other entities often do not test a selected set of attributes for each integrated circuit product being manufactured. Instead, the manufacturers and other entities perform a theoretical analysis of the integrated circuit design, measure these attributes for only a small number of samples, and claim that these particular attributes of the product are "guaranteed by design" (rather than simply "guaranteed"). Obviously, purchasers of the integrated circuit products prefer that a product be "guaranteed" rather than "guaranteed by design" since "guaranteed" implies that all attributes of all products have been individually tested.

BRIEF DESCRIPTION OF THE DRAWINGS

For a more complete understanding of this disclosure and its features, reference is now made to the following description, taken in conjunction with the accompanying drawings, in which:

FIGS. 9A1, 9A2, 9B1, 9B2, 9C1, 9C2, 9D1, 9D2, 9E1, 9E2, 9F1, 9F2, 9G1, 9G2, 9H1, 9H2, and 9I illustrate an example circuit layout of a phase noise/phase jitter test board according to this disclosure;

DETAILED DESCRIPTION

FIGS. 1, 2, 3, 4, 5, 6, 7, 8A, 8B, 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, 10D, 11, and 12, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
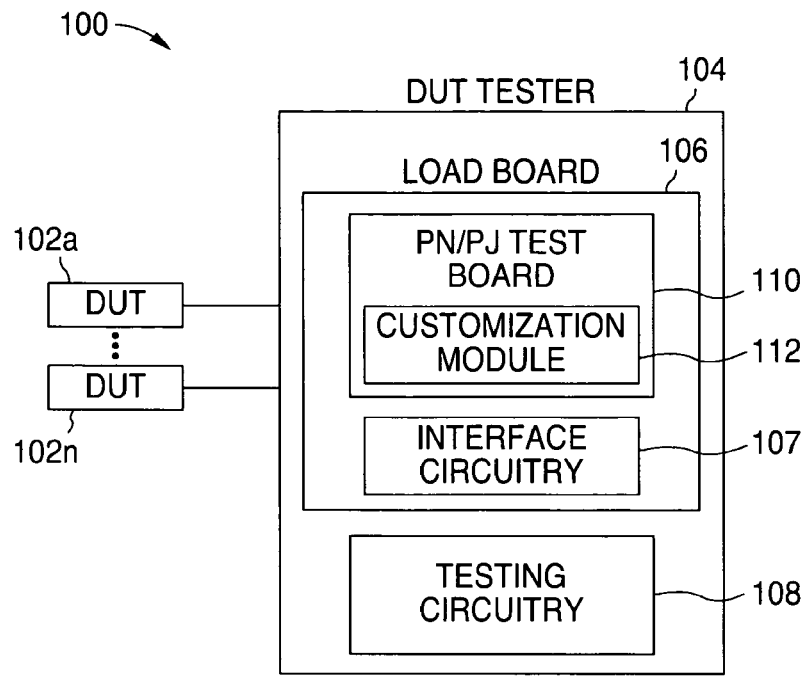
FIG. 1 illustrates an example system for measuring phase noise/phase jitter in devices under test according to this disclosure.

FIG. 1 illustrates an example system 100 for measuring phase noise/phase jitter in devices under test according to this disclosure. The embodiment of the system 100 shown in FIG. 1 is for illustration only. Other embodiments of the system 100 could be used without departing from the scope of this disclosure.

In this example, the system 100 includes one or more devices under test (DUTs) 102a-102n and a DUT tester 104. The devices under test 102a-102n represent integrated circuit devices to be tested in the system 100. The devices under test 102a-102n represent any suitable device(s) having integrated circuitry being tested. The devices under test 102a-102n could, for example, include semiconductor dies on wafers, semiconductor dies cut apart from wafers, packaged semiconductor parts, printed circuit boards, or any other or additional devices having any suitable integrated circuitry. Specific examples could include interface, clock, and data conversion products or any other devices having radio frequency (RF) oscillators or clocks. In FIG. 1, multiple devices under test 102a-102n are coupled to the DUT tester 104, and the devices under test 102a-102n could be tested simultaneously or sequentially by the DUT tester 104. However, the devices under test 102a-102n could also be coupled to the DUT tester 104 and tested individually.

The DUT tester 104 operates to test various aspects of the one or more devices under test 102a-102n. For example, the DUT tester 104 could inject signals into the devices under test 102a-102n and examine signals output by the devices under test 102a-102n. In this way, the DUT tester 104 can measure one or more characteristics of each of the devices under test 102a-102n. The DUT tester 104 can also analyze the results to determine whether the measured characteristic(s) of the devices under test 102a-102n are satisfactory, such as by comparing the measured characteristic(s) to desired or required values or ranges. The DUT tester 104 includes any suitable structure for testing one or more devices under test 102a-102n. The DUT tester 104 could, for example, include automated test equipment for automatically testing devices under test 102a-102n and routing devices under test 102a-102n to appropriate destinations based on the test results.

As shown in FIG. 1, the DUT tester 104 includes a load board 106. The load board 106 (also called a device interface board or "DIB") represents an interface that typically connects the DUT tester 104 to the devices under test 102a-102n. The load board 106 includes any suitable interface circuitry 107 facilitating interaction between the DUT tester 104 and the devices under test 102a-102n. For example, the load board 106 may include probes, contacts, sockets, or other structures that can be electrically coupled to one or more of the devices under test 102a-102n. The load board 106 may also include contacts or other structures that can be electrically coupled to the DUT tester 104. In this way, the DUT tester 104 may include components for stimulating one or more integrated circuits in the devices under test 102a-102n, and the load board 106 may allow electrical signals from the DUT tester 104 to reach the devices under test 102a-102n (and vice versa). In other words, the interface circuitry 107 helps to facilitate the measurement of various product attributes associated with the devices under test 102a-102n.

As shown here, the DUT tester 104 includes testing circuitry 108. The testing circuitry 108 is used to measure one or more characteristics of the devices under test 102a-102n. As particular examples, the testing circuitry 108 could cause various signals to be applied to the input pins of the devices under test 102a-102n and receive signals from the output pins of the devices under test 102a-102n via the load board 106. The testing circuitry 108 could then analyze the output signals and determine whether the devices under test 102a-102n satisfy certain criteria (such as whether one or more measured characteristics of the devices under test 102a-102n meet desired or required values or ranges). The testing circuitry 108 could represent any suitable circuitry for testing the devices under test 102a-102n, such as volt meters, current meters, zero-crossing detectors, and/or Fast Fourier Transform (FFT) analyzers.

In some embodiments, the testing circuitry 108 in the DUT tester 104 is capable of stimulating and testing a wide variety of devices under test 102a-102n. Also, different load boards 106 may be designed and used, where each load board 106 can interact with one or several types of devices under test 102a-102n. In this way, the same DUT tester 104 can be used to test many different devices that incorporate integrated circuits, and a load board 106 can be designed and used to test specific type(s) of devices. This may help to reduce the cost of the equipment used to test the devices under test 102a-102n.

As noted above, many manufacturers and other entities wish to test integrated circuit products, but testing every single aspect of every single integrated circuit product being manufactured is often time consuming and expensive. Not only that, the measurement equipment used to test the integrated circuit products is often extremely expensive. This disclosure provides a mechanism for measuring or testing the devices under test 102a-102n that can be easily used with the DUT tester 104. Also, this mechanism can be easily customized to specific devices under test 102a-102n. Moreover, this mechanism can be used to quickly test numerous devices under test 102a-102n, which could include all devices that are being manufactured in a particular facility. As a result, this disclosure provides a less expensive mechanism that can be used to quickly measure or test numerous devices under test 102a-102n. Further, this mechanism that is quicker than conventional systems, which may directly lower the cost of testing each device. In addition, this mechanism could be directly attached to the load board 106, thus saving the cost of installing large equipment enclosures on a test floor or in racks.

In this example, a test board 110 is coupled to or otherwise in communication with the load board 106 and the devices under test 102a-102n. The test board 110 contains various circuitry for measuring the phase noise/phase jitter (PN/PJ) of one or more of the devices under test 102a-102n. Phase noise and phase jitter generally represent fluctuations in the phase of a signal, and these phrases are sometimes used interchangeably. The test board 110 includes any suitable structure for testing or measuring phase noise/phase jitter. Example embodiments of the test board 110 are shown in FIGS. 2 through 7, which are described below.

In some embodiments, the test board 110 could represent a small sub-assembly that can be attached or coupled to the load board 106. The test board 110 can then be used to measure or test the phase noise/phase jitter of the devices under test 102a-102n via the load board 106. Moreover, the test board 110 could be implemented in a much less expensive manner and operate more quickly than conventional systems for testing phase noise/phase jitter. In addition, the test board 110 could be capable of measuring very small amounts of phase noise/phase jitter, such as by measuring phase noise/phase jitter down to 20 femtoseconds ($20 \times 10^{-15}$ seconds) or less. The test board 110 therefore provides a less expensive and highly sensitive and accurate technique for quickly measuring phase noise/phase jitter in a large number of devices under test 102a-102n. In particular embodiments, the test board 110 is programmable, such as by the DUT tester 104, to provide desired measurements to the DUT tester 104.

The test board 110 in this example includes a customization module 112. The customization module 112 can be used to customize the test board 110 for use with particular types of devices under test 102a-102n. For example, the customization module 112 could include circuitry implementing a phase shifter. Phase shifters may not work properly over a wide frequency range, and the customization module 112 allows a phase shifter personalized for a given frequency range to be used when testing the devices under test 102a-102n. This may allow the same test board 110 to be used with a wide range of devices under test 102a-102n, and different customization modules 112 could be used with devices under test 102a-102n that have different frequency ranges. The customization module 112 could include any other or additional components for customizing the test board 110 (and it is not limited to just phase shifters). In some embodiments, the customization module 112 may include components, such as user-movable jumpers, that can be used to manually customize the module 112 for a particular use. Also, in some embodiments, the customization module 112 could represent a small component that can be attached or coupled to the test board 110. In particular embodiments, the customization module 112 provides a very stable and low phase noise/jitter local oscillator carrier source to cover a particular frequency band. The customization module 112, which is often far less expensive to produce than the test board 110, provides a mechanism for using the same test board 110 for many different varieties of devices under test, thus further lowering the cost of testing the devices under test.

In one aspect of operation, the test board 110 measures phase noise/phase jitter in the devices under test 102a-102n. The devices under test 102a-102n could provide any suitable signals to the test board 110 for analysis, such as signals having a carrier frequency of 125 MHz-6 GHz, 700-800 MHz, 1450-1550 MHz, or 800 MHz-2.8 GHz. The phase noise/phase jitter in these signals could be measured in one or more sideband frequency ranges, such as from 10 kHz-10 MHz, 10 kHz-20 MHz, or down to 100 Hz. The phase noise/phase jitter level floor for these measurements could be at a very low level, such as −165 dBc/Hz corresponding to 2.7 femtoseconds at a 10 MHz bandwidth and a 1.5 GHz carrier signal.

The test board 110 could also measure the phase noise/phase jitter in a very short amount of time, such as by requiring less than 100 to 500 milliseconds for full accuracy. As a particular example, approximately 80 milliseconds could be required to accurately measure sideband components down to 10 kHz with an error of less than two percent. Measuring the integrated phase noise in the test board 110 over the entire designated sideband-width all at one time, instead of separate measurements at selected sideband frequencies followed by piece-wise integration, permits the additional processing time by the DUT tester 104 to be negligible.

Measuring the phase noise/phase jitter in the devices under test 102a-102n may allow characteristics of the devices under test 102a-102n to be "guaranteed" rather than "guaranteed by design." It may also allow problems with the devices under test 102a-102n to be more easily identified. Moreover, the test board 110 may be much less expensive than traditional equipment used to measure phase noise/phase jitter. In addition, the test board 110 could require re-calibration at an extended interval, such as once per year. This may help to reduce the expense of testing the devices under test 102a-102n while increasing the benefits of the testing.

In some embodiments, the test board 110 can take measurements related to phase noise/phase jitter in the devices under test 102a-102n in the time domain and/or the frequency domain. Measuring phase noise/phase jitter in the frequency domain may be useful for various reasons. For example, some devices under test 102a-102n have jitter limitations in only a certain portion of the spectrum. As a particular example, in transmit clocks for modems, a recovered clock is often not sensitive to low-frequency jitter. Also, making phase noise/phase jitter measurements in the frequency domain allows irrelevant noise spectra to be filtered out of the measurements, enabling more accurate measurements to be taken. Not only that, the phase noise/phase jitter measurements can be taken quickly, such as by measuring the entire baseband range at once. Further, jitter measurements in the frequency domain may be much more sensitive than measurements in the time domain, such as roughly 1000 times more sensitive. In addition, the presence of the customization module 112 allows the system 100 to be customized for particular uses, such as by allowing the use of a customized phase shifter or customized phase-locked loops (PLLs) of different frequencies.

Although FIG. 1 illustrates one example of a system 100 for measuring phase noise/phase jitter in devices under test 102a-102n, various changes may be made to FIG. 1. For example, any number of DUT testers 104 can be used in the system 100, and each DUT tester 104 could be coupled to any number of devices under test 102a-102n. Also, each DUT tester 104 could be coupled to any number of test boards 110, and each test board 110 could be coupled to any number of customization modules 112. In addition, the use of the customization module(s) 112 is optional, and the functionality of the customization module(s) 112 could be incorporated into the test board 110.

FIGS. 2 through 7 illustrate example phase noise/phase jitter test boards for use with a product tester according to this disclosure. In particular, FIGS. 2 through 7 illustrate example embodiments of the test board 110 of FIG. 1. The embodiments of the test board 110 shown in FIGS. 2 through 7 are for illustration only. Other embodiments of the test board 110 could be used without departing from the scope of this disclosure.

Figure 2:
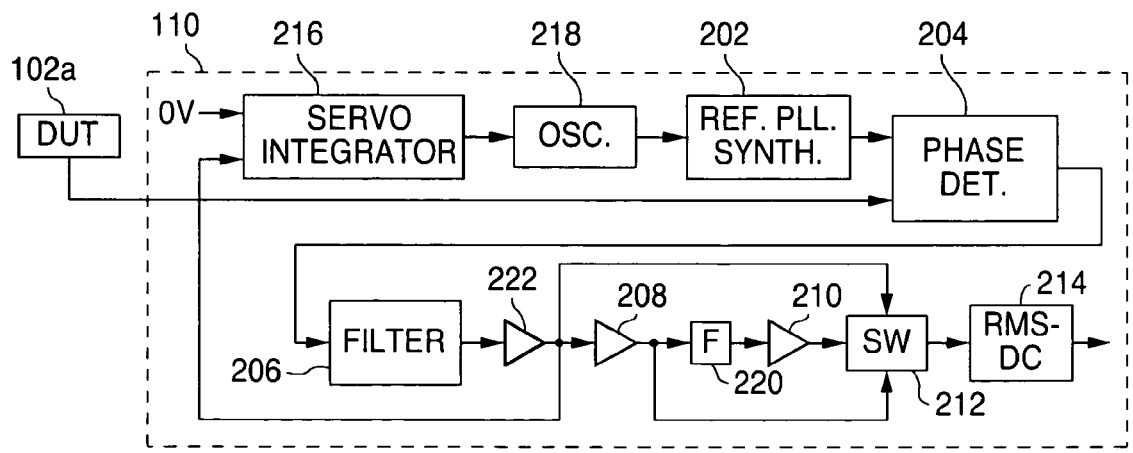
FIGS. 2 through 7 illustrate example phase noise/phase jitter test boards for use with a product tester according to this disclosure.

FIG. 2 illustrates an example test board 110 that implements a frequency/phase locked loop local reference oscillator direct conversion measurement system. In FIG. 2, the test board 110 includes a reference PLL synthesizer 202. The reference PLL synthesizer 202 generates a reference signal that is used during the measurement of phase noise/phase jitter in a device under test 102a. The reference PLL synthesizer 202 can be programmed (such as by the DUT tester 104) to have a specified output frequency. As a particular example, the reference PLL synthesizer 202 can be programmed to have the same frequency as the device under test 102a or a frequency close to the frequency of the device under test 102a. The reference PLL synthesizer 202 includes any suitable structure for generating a reference signal, such as a structure for generating a 0.9 GHz-2.7 GHz reference signal. The reference PLL synthesizer 202 could reside on the test board 110 or the customization module 112.

The output of the reference PLL synthesizer 202 and an output from the device under test 102a (such as an RF signal) are received by a phase detector 204. The phase detector 204 detects a phase difference between the signals from the reference PLL synthesizer 202 and the device under test 102a. The phase detector 204 outputs a signal based on the detected phase difference. The phase detector 204 includes any suitable structure for determining a phase difference between signals, such as a passive double-balanced RF mixer.

The output of the phase detector 204 is provided to a filter 206, which filters the signal from the phase detector 204. The filtered output is then provided to a baseband amplifier 208, which amplifies the signal from the filter 206. The output of the amplifier 208 is also amplified by a bandpass filter 220. The filter 206 represents any suitable filter, such as a low-pass filter. The amplifiers 208 and 210 represent any suitable amplification components. The amplifier 208 could, for example, represent a low noise amplifier (LNA) that operates in the 10 kHz-10 MHz or 100 Hz-20 MHz range (which could represent the applicable phase noise/phase jitter sideband frequency range).

The amplified signals from the band-limited amplifiers 208 and 210 are provided to a switch 212. The switch 212 passes one of the signals it receives as inputs to its output. In this way, the switch 212 can provide various signals in various baseband frequency ranges that are used to identify the amount of phase jitter/phase noise in the device under test 102a. The switch 212 includes any suitable structure for selectively outputting one of multiple input signals.

A conversion unit 214 receives the output of the switch 212 and converts the output into any other suitable value. For instance, the conversion unit 214 in this example may receive a Root Mean Square (RMS) value associated with the amount of phase jitter/phase noise in the device under test 102a and convert the RMS value into a direct current (DC) value. The DC value could then be provided to any suitable destination, such as the DUT tester 104, for further processing. The conversion unit 214 includes any suitable structure for converting a signal. Also, any other suitable circuitry could be used here to generate values for processing by the DUT tester 104, such as various circuitry described below.

As shown in FIG. 2, the output of the filter 206 is also provided to a servo integrator 216. The servo integrator 216 also receives a reference voltage, which in this example is 0V. In this embodiment, the servo integrator 216 may compare the signal provided by the filter 206 to the reference voltage and integrate the differences over a specified period of time. The servo integrator 216 may then generate an output signal for controlling an oscillator 218. The oscillator 218 generates a signal for controlling the reference PLL synthesizer 202, where the signal provided by the oscillator 218 is based on the signal output by the servo integrator 216. In this way, the servo integrator 216 and the oscillator 218 form a feedback loop for controlling the reference PLL synthesizer 202. As a particular example, the servo integrator 216 and the oscillator 218 may control the reference PLL synthesizer 202 so that the phase detector 204 generates an output having an average of 0V (equal to the reference voltage received by the servo integrator 216). The servo integrator 216 includes any suitable structure for integrating voltages over a specified period of time. The oscillator 218 includes any suitable oscillating structure, such as a voltage-controlled crystal oscillator (VXCO). In this example, the VCXO (oscillator 218) may act as a variable reference for an entire PLL synthesizer. Conventional phase noise measurement systems of this type may utilize only a voltage-controlled oscillator or "VCO" (instead of a voltage-controlled crystal oscillator). Spurious coupling of this otherwise "naked" VCO to a device under test oscillator is often a source of trouble, which has often eliminated this type of measurement technique from consideration on prior occasions.

In one aspect of operation, the test board 110 can be used to measure phase noise/phase jitter in the device under test 102a. In particular, the phase noise of the device under test 102a can be measured and converted into an amplitude baseband signal, which can be further processed by the DUT tester 104. The reference PLL synthesizer 202 can be programmed to generate a reference signal having a frequency equal to the expected frequency of the device under test 102a. The servo integrator 216 can also be configured to require a 0V average from the phase detector 204 by providing a 0V reference voltage to the servo integrator 216. Owing to the salient characteristic of the phase detector 204, this means that the reference signal provided by the reference PLL synthesizer 202 and the signal provided by the device under test 102a should be in quadrature, resulting in a 0V DC component. Under these conditions, all of the phase noise (and any other angular modulation) from both inputs of the phase detector 204 is converted to amplitude noise, and the RMS noise level can be measured at the output of the amplifier 210 by coupling the amplifier 210 to the conversion unit 214 via the switch 212. This value may represent the combined phase noise of both sidebands of the reference PLL synthesizer 202 and both sidebands of the device under test 102a. Each set of noise sidebands can have equal level and phase, but the noise sidebands of the reference PLL synthesizer 202 may be incoherent with those of the device under test 102a.

The reference PLL synthesizer 202 can then be programmed to generate a reference signal having a frequency that is close to the expected frequency of the device under test 102a. As a particular example, the reference signal could be programmed to be close enough in frequency to that of the device under test so that the difference frequency is within the passband of the amplifier 208 and an amplifier 222, such as when the reference signal is within 1 MHz of the expected frequency of the device under test 102a. This leads to the creation of a beat note, which results from the frequency difference between the reference signal and the signal from the device under test 102a. The RMS level of a heterodyne beat note can be measured at the output of the amplifier 222 by coupling the amplifier 222 directly to the conversion unit 214 via the switch 212. The output of the amplifier 222 represents the carrier level of the signal from the device under test 102a.

An integrated single sideband phase noise value that is relative to the DUT carrier level can then be determined by correcting for the gain of the amplifier 208 and the addition of correlated sidebands. The resulting value may represent the phase noise of the device under test 102a if the noise from the reference PLL synthesizer 202 is negligible. If the noise from the reference PLL synthesizer 202 is not negligible but known, the integrated single sideband phase noise value that is relative to the carrier level of the device under test 102a can be determined nevertheless. This technique for measuring phase noise may be stable because it is independent of the variations in the DUT carrier level and it is independent of the variations present in the test board 110 (except for in the amplifiers 208 and 210, which could be AC-coupled and constructed from operational amplifiers to make them stable, as well).

In this example, the conversion unit 214 may capture the combined integrated phase noise sidebands of the device under test 102a and the reference PLL synthesizer 202 within the spectral region permitted by the baseband filtering contained within the amplifiers 208 and 222. However, there is sometimes a need to know the integrated noise value in separate parts of the spectrum. For instance, there may be a need to know the integrated noise between 100 Hz offset from the carrier frequency up to 20 MHz offset from the carrier frequency. Since the noise close to the carrier frequency can be relatively strong, relatively little baseband gain would be needed so as to avoid overload, and the switch 212 can be set to provide the output of the amplifier 208 (which could pass all frequencies from 100 Hz to 20 MHz, for example). There may also be a need to know how much of this noise is in a specified region, such as from 300 kHz to 20 MHz. Even though this spectral region segment may have almost all of the bandwidth of the larger spectral region, there may be very little of the noise power, and the additional gain provided by the amplifier 210 may be needed. The switch 212 is therefore set to provide the output of the amplifier 210, and its input can be coupled to a filter 220 (such as a 300 kHz high-pass filter).

The amplifier 222 may represent a baseband preamplifier that provides a relatively low noise figure to minimize system noise. This functionality can be used to detect very low amounts of noise from the device under test 102a. The gain of the amplifier 222 could be large enough only to preserve this low system noise figure despite possible higher noise figures of the stages that follow (the amplifiers 208-210). The third position of the switch 212 can be used to select the output of the amplifier 222, and this can be used for a calibration that occurs for each device under test 102a. For example, when the reference PLL synthesizer 202 and the carrier signal from the device under test 102a are at the same frequency and in quadrature at the phase detector's inputs, the noise signal level of the device under test 102a present at any point in the circuit following the phase detector 204 may be a function of:

the DUT carrier's noise sideband level relative to the carrier level;

the carrier level itself (as it emerges from the device under test 102a); and the gain of all stages preceding that point in the circuit.

The calibration performed using the amplifier 222 can be used to help remove (i) the power output level of the device under test 102a and (ii) measurement system gain variables from the measurement. This can be done by measuring both the sideband phase noise level and the carrier level and calculating the ratio.

It may be noted that the phase noise level is often small, so it is often measured after a considerable amount of gain. However, the carrier level is often large, so it is often measured after only a small amount of gain (such as at the output of the amplifier 222). The carrier level can be measured by (i) setting the switch 212 to connect the output of the amplifier 222 to the input of the conversion unit 214 and (ii) causing the reference PLL synthesizer 202 to differ in frequency by some amount to place the beat note inside the passband of the amplifier system. The beat note level may be directly proportional to the carrier level of the device under test 102a. A formula used to calculate the ratio between the integrated phase noise and the carrier level can include the gain of the system between the output of the amplifier 222 and the input of the conversion unit 214. For example, the integrated noise in one sideband relative to the carrier (dBc) can be expressed as:

$$20\log(P/B/G/2). \qquad (1)$$

Here, P represents the voltage of the phase noise (from the device under test 102a and the reference PLL synthesizer 202 on the same frequency and at phase quadrature) at the output of the conversion unit 214. B represents the voltage of the beat note at the output of the conversion unit 214. G represents the voltage gain of the system between the output of the amplifier 222 and the input of the conversion unit 214. Actual implementations may vary from this general equation due to various factors, such as configuration of the switch 212, non-ideal behavior of the conversion unit 214, and measurement system noise floor. In any case, the proper formula can be programmed, for example, into the DUT tester 104 and used during testing of the device under test 102a. Also, the gain G can be measured periodically, such as with the aid of a suitable RF attenuator switched in and out at the output of the device under test 102a.

In some embodiments, the gain of the amplifier 222 can be large enough to preserve the system noise figure, yet small enough so that the beat note level stays within its linear region for all possible power output levels of the device under test 102a and system gain variations between the device under test 102a and the output of the amplifier 222. The system gain variations could, for example, be associated with cabling between the device under test 102a and the amplifier 222, the phase detector 204, and the local oscillator drive to the phase detector 204 (i.e. the output level of the reference PLL synthesizer 202). The system gain between the output of the amplifier 222 and the input to the conversion unit 214 may be known and stable.

In other embodiments, rather than using a separate beat note calibration measurement for every device under test 102a, an automatic gain control (AGC) system can be used. The AGC system may include a stable detector at the input to the phase detector 204 from the device under test 102a, another servo integrator, and a variable gain amplifier and/or variable attenuator placed before the phase detector 204. These components can be used to adjust the gain of the signal from the device under test 102a before the signal reaches the phase detector 204.

Figure 3:
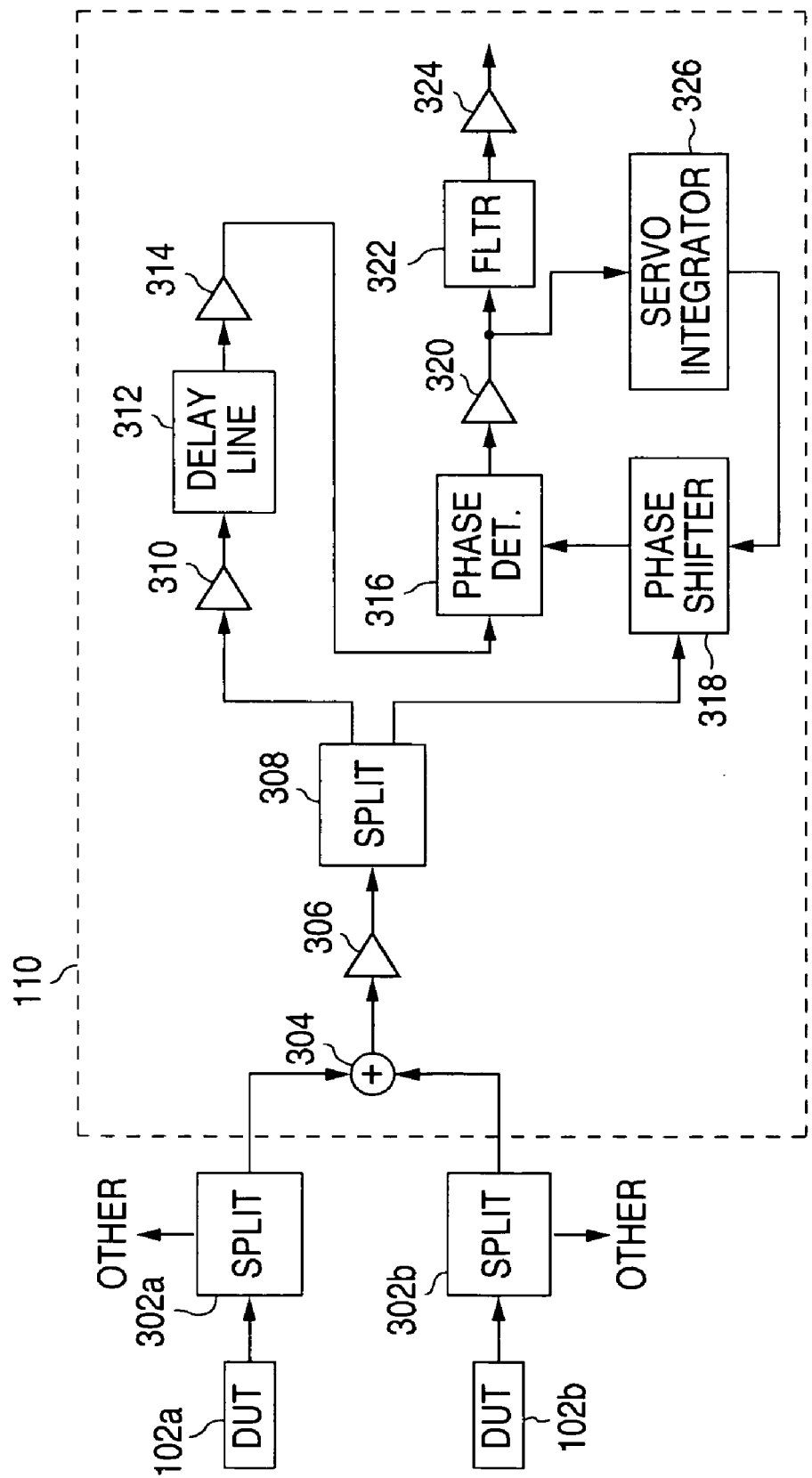

FIG. 3 illustrates an example test board 110 that implements a delay line discriminator direct conversion measurement system. In FIG. 3, multiple devices under test 102a-102b are coupled to the test board 110. Here, the load board 106 includes two splitters 302a-302b, each of which splits the signal from one of the devices under test 102a-102b. This allows the signals from the devices under test 102a-102b to be processed by the test board 110 and by other circuitry, such as other circuitry in the DUT tester 104. Each of the splitters 302a-302b represents any suitable device for splitting or dividing signals (evenly or unevenly), such as RF splitters.

Split or divided signals from the splitters 302a-302b are combined by a combiner 304 in the test board 110. This allows multiple devices under test 102a-102b to be tested in rapid sequence without the use of relays (as long as the device outputs can be individually switched on and off). The combiner 304 represents any suitable device for combining signals, such as an RF combiner. It may be noted that a single device under test 102a-102b could be tested by the test board 110 at any one time, and the combiner 304 (along with one of the splitters 302a-302b) could be omitted, or the combiner 304 could be replaced by a relay that selectively passes the signal from one of the splitters 302a-302b.

In this example, the output of the combiner 304 is amplified by an amplifier 306. The amplifier 306 can amplify the signal by any suitable amount, such as by providing an output between +13 dBm to +16 dBm. The amplifier 306 represents any suitable structure for amplifying a signal, such as an RF amplifier that operates over a frequency range of 0.25 GHz-5.5 GHz. The amplified signal provided by the amplifier 306 is then split by a splitter 308. The splitter 308 represents any suitable device for splitting or dividing signals (evenly or unevenly), such as an RF splitter.

One signal from the splitter 308 is received by an amplifier 310, which amplifies the signal. The amplified signal is then provided to a delay line 312, which delays the amplified signal by a specified amount. The delay line 312 could, for example, delay the signal by 50 to 500 nanoseconds. The delayed signal is then amplified by an amplifier 314. The output of the amplifier 314 is provided to a phase detector 316. Each of the amplifiers 310 and 314 represents any suitable structure for amplifying a signal, such as an RF amplifier. The amplifier 314 could represent a low noise, low gain amplifier, such as one that provides a signal to the phase detector 316 at a drive level of +5 dBm. The delay line 312 represents any suitable structure for delaying a signal.

Another signal from the splitter 308 is received by a phase shifter 318. The phase shifter 318 operates to shift the phase of the signal received from the splitter 308. For example, the phase shifter 318 could shift the phase of the signal from the splitter 308 by 90° with respect to the carrier frequency. The shifted signal is then provided to the phase detector 316. The phase shifter 318 includes any suitable structure for shifting the phase of a signal, such as an RF phase shifter that provides a shifted signal to the phase detector 316 at a drive level of +10 dBm. A phase shifter 318 having an octave frequency range and ±180° could, for example, be formed using conventional surface-mount hybrid quadrature units and varactor diodes.

The phase detector 316 detects a phase difference between the signals received from the amplifier 314 and the phase shifter 318. The phase detector 316 includes any suitable structure for determining a phase difference between signals, such as a passive double-balanced RF mixer.

The output of the phase detector 316 is provided to an amplifier 320, a filter 322, and an amplifier 324. The amplifiers 320 and 324 represent any suitable amplifiers, such as RF amplifiers. The amplifier 320 could represent a low noise preamplifier similar to the amplifier 222. The amplifier 324 could represent a band-pass amplifier (such as one with a range of 100 Hz-300 kHz or 100 Hz-6 MHz). The filter 322 represents any suitable filter, such as a low-pass filter or a low-frequency bandpass/peaking filter. Additional circuitry could also receive and process the signal from the phase detector 316, such as an RMS detector, conversion unit, or FFT analyzer.

The output of the phase detector 316 is also provided to a servo integrator 326. The servo integrator 326 integrates values over a specified time period to control the operation of the phase shifter 318, such as by adjusting one or more components of the phase shifter 318 based on integrated voltages. The adjustments to the phase shifter 318 may help to maintain a 90° phase difference at the carrier frequency between the two inputs of the phase detector 316, which is needed to convert phase noise modulation to amplitude information. As the carrier frequency is varied, the delay line 312 causes phase changes at its input to the phase detector 316, so the phase shifter 318 can be adjusted to maintain the 90° phase difference between the two inputs of the phase detector 316. Owing to a salient characteristic of its design, the phase detector 316 delivers (i) a small voltage of different polarities and gradually increasing level as the phase difference at its inputs varies in either direction from 90° and (ii) a voltage of exactly zero volts at a 90° phase difference. This "signed error signal" behavior permits the application of a proportional controller (in this case, the servo integrator 326) to automatically control the phase shifter 318 to maintain a 90° phase difference between signals at the two inputs of phase detector 316. The servo integrator 326 includes any suitable structure for integrating voltages over a specified period of time, such as one that drives the phase shifter 318 with a total range exceeding 360°.

In one aspect of operation, the test board 110 operates to measure the spectral density of sideband phase noise at various offset frequencies (such as those ranging from 1 kHz to 5 MHz) from the carrier frequency (such as those ranging from 0.8 GHz to 2.2 GHz). The test board 110 splits a signal from one or more devices under test 102a-102b (in sequence if multiple devices under test are used) using the splitter 308. One path goes through the delay line 312 and optionally through a low gain, low noise amplifier (the amplifier 314) to the RF input of the phase detector 316. The other path goes through the phase shifter 318 to the local oscillator input of the phase detector 316.

The phase shifter 318 is adjusted so that the phase detector inputs have a 90° difference at the carrier frequency. The combination of the delay line 312, the phase shifter 318, and the phase detector 316 forms a frequency modulation (FM) detector, otherwise known as a discriminator. The delay provided by the delay line 312 could be related only to the frequencies of applicable sidebands being measured (and it could have nothing to do with the RF carrier frequency). In order to provide the maximum possible sensitivity (baseband signal with a usable level of measured noise sufficiently above system noise), the phase detector 316 can be implemented as a double-balanced mixer having a maximum of +10 dBm at its local oscillator input (from the phase shifter 318) and +7 dBm at its RF input (from the amplifier 314). If the attenuation of the delay line 312 is small enough, the amplifier 314 may not be needed.

The output of the phase detector 316 is provided to a low noise DC amplifier (the amplifier 320). The amplifier 320 is used to bring the signal level high enough so any cascaded noise figure of the remaining circuitry is not a significant factor. The output of this amplifier 320 feeds the servo integrator 326, which drives the phase shifter 318. The amplifier 324 could represent a band-pass amplifier with adequate gain to feed an FFT analyzer (such as with a signal that is not less than −80 dBm and 22.4 µV RMS into 50 Ohms).

As noted above, the delay line 312 could be implemented in any suitable manner. For example, the delay line 312 could be implemented as a trace on a printed circuit board, and the printed circuit board could include a dielectric such as RO3003 (a ceramic-filled polytetrafluoroethylene composite). This material could have a dielectric thickness of five mils, and the trace width for 50 Ohms may be eleven mils. The total area of the delay line 312, including a three-times line separation, could be approximately 17.14 square inches. If the load board 106 is about 100 square inches, the delay line 312 could be implemented on the load board 106 (as opposed to on the test board 110) while leaving adequate room for other wiring or circuitry, greater separation, and placement of thru-hole vias. In particular embodiments, the test board 110 (including the delay line 312) can be implemented directly on the load board 106. In these embodiments, the RO3003 dielectric is used on the top surface layer of the test board 110 implemented on the load board 106 (not its internal layers), and the top surface layer of the test board 110 can also be used for transceiver and synthesizer circuitry. Only +10 dBm may be needed into the delay line 312, and the delay line 312 may or may not be shielded.

In some embodiments, the test board 110 may operate over a broad frequency band, and the delay line 312 could provide a continuously varying phase shift even if the phase shifter 318 could be maintained at a constant phase over a considerable carrier frequency range. The servo integrator 326 helps to maintain the 90° phase shift provided by the phase shifter 318 by electronically controlling the phase shifter 318, and this control can be automatically adjusted during every measurement to provide 0V DC (no DC offset) at the output of the phase detector 316 (which occurs at a 90° phase shift between the two input signals).

Among other things, the test board 110 in FIG. 3 may require no local oscillators and no phase locking. This may be useful for frequency-drifting signals from the devices under test 102a-102b, such as signals from unlocked voltage-controlled oscillators. The delay line 312 may only require, for instance, a 50 nanosecond delay when measuring 5 kHz-5 MHz sidebands and a 500 nanosecond delay when measuring 500 Hz sidebands. The test board 110 may operate to measure phase noise by measuring frequency deviation (i.e. its measurements are linear with frequency deviation). The test board 110 may be more sensitive to phase modulation as the modulating (offset) frequency increases. The modulating frequency and the offset sideband frequency could be numerically equal, and there may be no other sidebands because the amount of modulation is very small (the frequency deviation divided by the modulating frequency is less than one). For any given modulating frequency, the sensitivity of the test board 110 could increase as the time delay of the delay line 312 increases, but it may only increase until the time delay reaches a specified value (such as approximately T/4, where T is 1/f, and where f is the modulating frequency). For a modulating frequency of 5 MHz, this equals approximately 50 nanoseconds. With a reasonable drive level to the phase detector 316 (such as +10 dBm at the local oscillator input and +5 dBm at the RF input), the sensitivity of the test board 110 at the 5 MHz offset could be about −170 dBc/Hz; at 1 MHz it could be about −160 dBc/Hz; at 100 kHz it could be about −140 dBc/Hz; at 10 kHz it could be about −120 dBc/Hz; and at 1 kHz it could be about −90 dBc/Hz. If the delay time of the delay line 312 is increased to 500 nanoseconds, the sensitivity may improve to about −115 dBc/Hz at 1 kHz.

Figure 4:
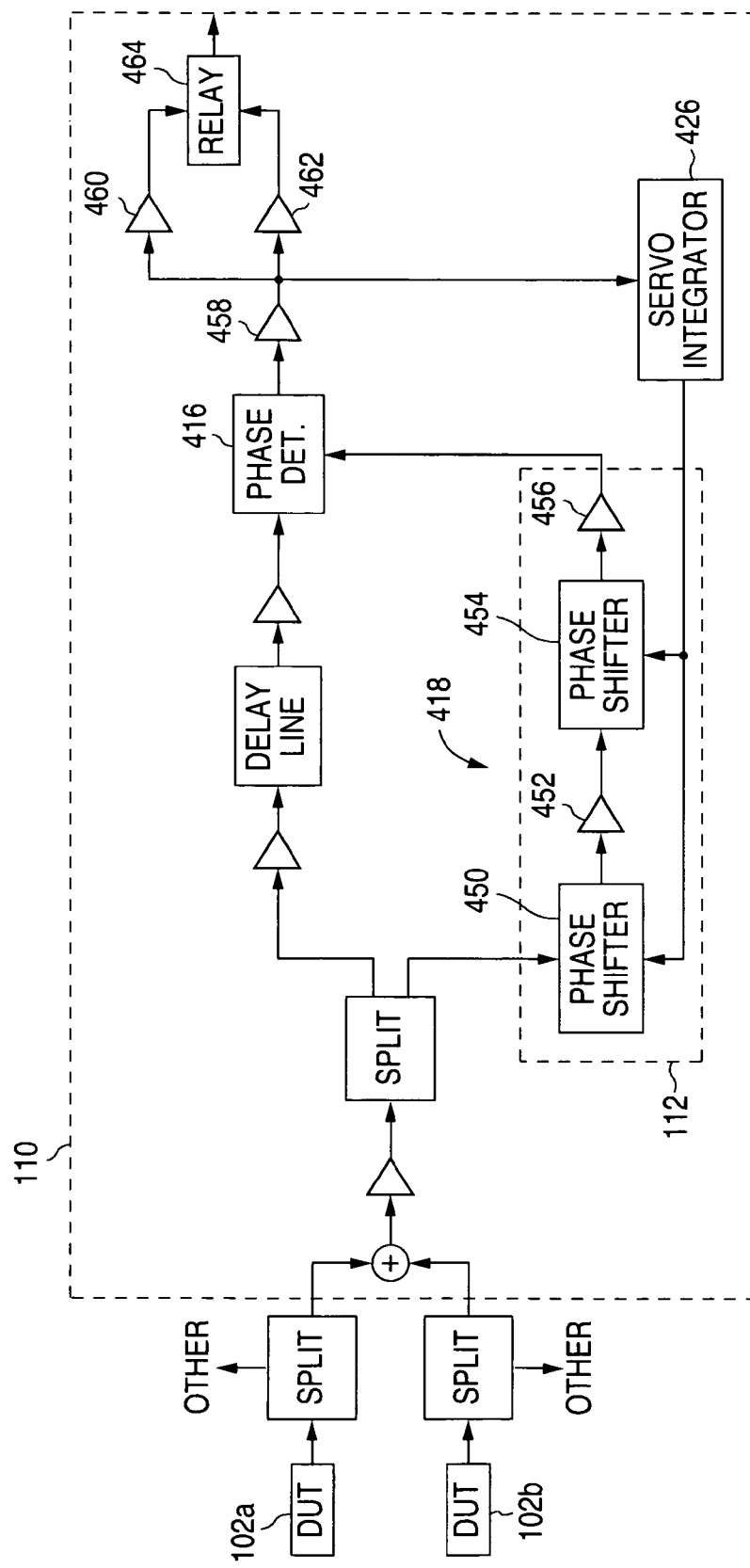

FIG. 4 illustrates another example test board 110 that implements a delay line discriminator direct conversion measurement system. In FIG. 4, the test board 110 has a similar configuration as the test board 110 shown in FIG. 3. However, as shown in FIG. 4, a phase shifter 418 is implemented in the test board 110 within the customization module 112. In this example, the phase shifter 418 is formed from a voltage-controlled phase shifter 450, an amplifier 452, another voltage-controlled phase shifter 454, and another amplifier 456. The voltage-controlled phase shifters 450 and 454 are controlled by a servo integrator 426 in the same or similar way as described above. The voltage-controlled phase shifters 450 and 454 can be customized or personalized for particular devices under test 102a-102b, such as by limiting the phase shifters 450 and 454 to use over a particular frequency range. Each of the voltage-controlled phase shifters 450 and 454 includes any suitable structure for shifting the phase of a signal based on a voltage control signal. Each of the amplifiers 452 and 456 includes any suitable structure for amplifying a signal, such as an RF amplifier.

In this example, the signal from the phase shifter 418 is provided to a phase detector 416. An output from the phase detector 416 is provided to an amplifier 458, which could represent a preamplifier having a range of DC-10 MHz. Two amplifiers 460-462 receive and amplify an output of the amplifier 458. The amplifiers 460-462 may have different frequency ranges. For instance, the amplifier 460 could have a frequency range of 800 Hz-300 kHz, and the amplifier 462 could have a frequency range of 300 kHz-6 MHz. The outputs of the amplifiers 460-462 are provided to a relay 464, which selectively provides the signals to an FFT analyzer (such as by providing −80 dBm to −20 dBm signals).

Figure 5:
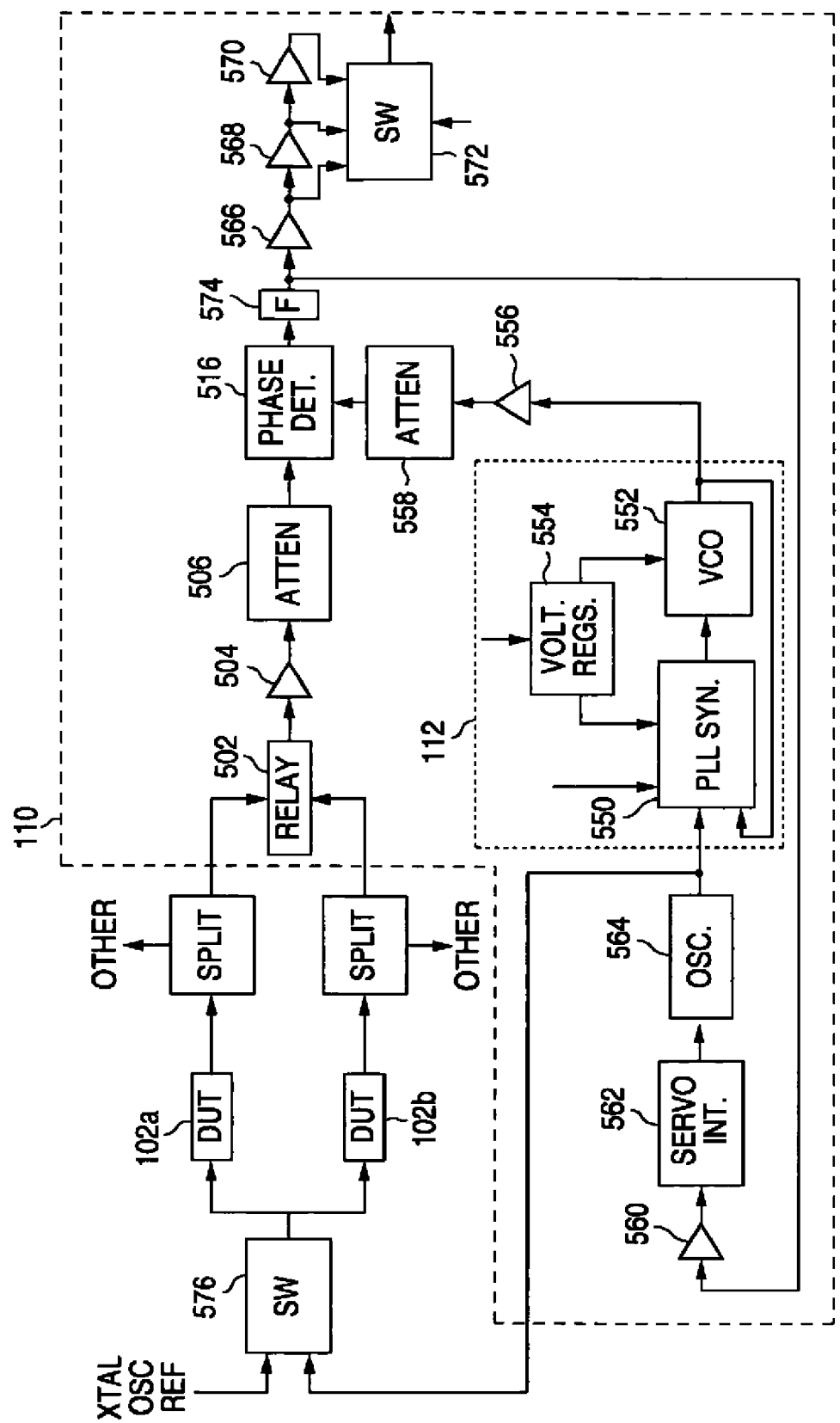

FIG. 5 illustrates an example test board 110 that implements a "two-oscillator" measurement system using a phase/frequency locked loop, as previously described with respect to FIG. 2. In FIG. 5, the test board 110 includes a relay 502, an amplifier 504, and an attenuator 506. The relay 502 passes a signal from one of the devices under test 102a-102b to the amplifier 504. The relay 502 can be controlled by an external control signal, which determines which signal from the devices under test 102a-102b is passed to the amplifier 504. The amplifier 504 amplifies the signal from the relay 502, such as to make up for a small signal from the device under test 102a or 102b and/or losses from the relay 502, splitters located on the load board 106, and the attenuator 506. The objective may be to present a phase detector 516 with as large a signal as possible that is still within the linear range of the phase detector 516. As a particular example, the device under test may deliver −9 dBm, a splitter on the load board 106 may provide a 4 dB loss, and the relay 502 may provide a 1 dB loss. The amplifier 504 could therefore provide a 10 dB gain, and the attenuator 506 could provide a 3 dB loss, thus leaving a signal level of −7 dBm to enter the phase detector 516. The attenuator 506, employed in the circuit to present the phase detector input with a relatively uniform broad band resistive impedance, may reduce the amplitude or power of the signal output by the amplifier 504, such as by reducing the amplitude or power of the signal to −7 dBm. This attenuated signal is then provided to the first input of the phase detector 516.

In this example, the second input of the phase detector 516 is based on a signal provided by the customization module 112. The customization module 112 here includes a PLL synthesizer device 550, a voltage-controlled oscillator (VCO) 552, and one or more voltage regulators 554. The PLL synthesizer device 550 generates a signal based on three inputs, one of which is provided by the VCO 552 and another of which is a control signal (such as a control signal to control the frequency of the VCO 552 and possibly other aspects of the PLL synthesizer device 550). The VCO 552 generates an output signal based on the signal from the PLL synthesizer device 550. The output of the VCO 552 generally represents a signal having a desired frequency, such as a 0.9 GHz-2.7 GHz signal. The one or more voltage regulators 554 provide proper operating voltages to the PLL synthesizer device 550 and VCO 552, such as operating voltages generating using a supply voltage $V_{CC}$. In some embodiments, the voltage regulator 554 may represent an SOT23-sized voltage regulator. Also, the PLL synthesizer device 550 and VCO 552 could be implemented using a pre-phase noise-measured device of the same variety as used in the device under test 102a-102b. For other devices under test 102a-102b, the customization module 112 could include a VCO 552, PLL synthesizer device 550, and/or other components that produce the same (or better) phase noise/jitter performance than that used on the load board 110 as the devices under test.

The output of the VCO 552 is provided to an amplifier 556, which amplifies the signal. An attenuator 558 may then attenuate the amplified signal. For example, the VCO 552 may drive the amplifier 556 at +3 dBm, the amplifier 556 may drive the attenuator at +13 dBm, and the attenuator 558 may attenuate the signal to the phase detector 516 to +10 dBm. The attenuator 558 is employed in the circuit in order to present the phase detector input with a relatively uniform, broad band resistive impedance.

As shown here, the third input to the PLL synthesizer device 550 is based on the output of the phase detector 516 and a low-pass filter (F) 574. In this example, the low-pass filter 574 may pass only frequencies from DC to the highest sideband frequencies converted to baseband for which the noise and beat note levels are being measured. This helps to remove all other spectral components emanating from the phase detector 516, including vestiges of the reference and DUT carrier and sideband energy at RF, energy at the sum frequencies, and energy at the harmonics. One example of the highest baseband frequency to be passed could be 20 MHz, and one example of a frequency set to be rejected is in the neighborhood of 870 MHz together within the neighborhood of 1740 MHz.

An amplifier 560 may receive and amplify the output of the phase detector 516 followed by the low-pass filter 574. The amplifier 560 could, for example, represent a low-pass amplifier (such as one having a range of DC-20 kHz). The output of the amplifier 560 is provided to a servo integrator 562, which integrates the signal from the amplifier 560. The servo integrator 562 could, for example, have a loop bandwidth of 100 Hz. Modulation components within the loop bandwidth, including noise, are filtered out and do not pass through to the baseband amplification subsystem beginning with the amplifier 566. As a result, the loop bandwidth may not be any larger than the lowest sideband noise frequency to be measured. Adjustments of the loop bandwidth can be used to determine the lowest sideband noise frequency to be measured, in place of or in addition to the high-pass filtering within the baseband amplification subsystem. It may be understood, however, that the loop bandwidth referred to thus far here is that of an "outer loop" controlled by an oscillator 564. This loop bandwidth could always be considerably narrower than that of the PLL synthesizer device 550 present in the customization module 112 in order to obtain overall loop stability. For instance, if the PLL synthesizer device 550 in the customization module 112 has a loop bandwidth of 10 kHz, the outer loop bandwidth may be limited to 2 kHz and below.

The integrated output of the servo integrator 562 is provided to the oscillator 564, which generates an output signal for controlling the PLL synthesizer device 550. The oscillator 564 could, for example, represent a voltage-controlled crystal oscillator having a 10 MHz frequency. In this embodiment, the servo integrator 562 and the oscillator 564 form a feedback loop for controlling the PLL synthesizer device 550. Also, the servo integrator 562 and the PLL synthesizer device 550 may adjust the VCO 552 so that the VCO 552 is phase and frequency locked with the DUT signal, with the output of the phase detector 516 at 0V from the combined RF carriers with normally-distributed noise voltage noticeable after considerable amplification.

As shown here, the output of the phase detector 516 (after passing through the low-pass filter 574) is also provided to an amplifier 566. The amplifier 566 could, for example, represent a low noise amplifier having a frequency range of up to 20 MHz and a voltage gain of 10 or 20. This amplifier 566 has a large enough voltage gain to protect the overall system noise figure, yet small enough gain that the difference frequency "beat" signal does not limit in its output. The output of the amplifier 566 is provided to an amplifier 568, which could represent a bandpass amplifier having a frequency range of 100 Hz-20 MHz or 10 kHz-10 MHz and a gain of 100. The output of the amplifier 568 is provided to another amplifier 570, which again could represent a bandpass amplifier having a frequency range of 300 kHz-20 MHz and a gain of 30. The outputs of the three amplifiers 566-570 are provided to a switch 572, which can selectively provide one of the signals to an external destination, such as an FFT analyzer or other amplitude measuring device. The switch 572 can be controlled by a digital control signal from an external source, such as from the DUT tester 104.

In this example embodiment, the phase/frequency locked loop in the test board 110 is implemented using the customization module 112 directly attached to the test board 110. Conventional "two-oscillator" measurement systems often suffer from various problems or drawbacks. For example, conventional "two-oscillator" measurement systems often suffer from the unavailability of an auxiliary oscillator source (a source that is not a device under test) with an adequately low phase noise, especially for wideband coverage. Conventional systems also have a larger expense due to the need for multiple auxiliary oscillator sources (one for each frequency range), and conventional self-controlled (rather than PLL controlled) systems have a reputation for false locking.

The "two-oscillator" measurement system illustrated in FIG. 5 provides various benefits over conventional systems. For example, the disadvantages associated with PLL drift and uncontrolled source drift are not relevant, so false locking and difficulty in maintaining quadrature at the phase detector inputs are not present. Also, no delay line is required in this circuit. Further, no phase shifter is needed since quadrature at the phase detector inputs can be maintained automatically by the phase/frequency locked loop controlling the auxiliary oscillator (VCO 552, which is not in the device under test). Beyond that, the measurement sensitivity may not vary with offset frequency, so the calibration process can be simpler. Also, measurements can be made for very low offset frequencies (such as down to 10 Hz), and the sensitivity may be better than a 50 μs delay line type for offset frequencies up to 50 MHz. In addition, less power may be needed from the oscillators since there are no lossy delay lines or phase shifters, and the components are fewer and therefore less costly. In particular embodiments, a thermal noise floor at the output of the phase detector 516 could be approximately −170 dBc/Hz for a 1 dB low noise amplifier 566.

In some embodiments, the two-oscillator measurement system may be well-suited for devices under test 102a-102b that are stable (such as PLL synthesizers). If the reference source (the customization module 112) is also stable, it is generally simple to maintain quadrature at the phase detector inputs, which helps to cancel amplitude noise and to convert phase noise into an amplitude-calibrated signal. It may not be necessary for the reference oscillator (oscillator 564) to have much lower noise than the device under test 102a-102b, and it may be helpful for the reference source to be at least as good as the device under test 102a-102b. The reference source may have known phase noise values (such as pre-measured values), but these measurements can be made without the assistance of a previously calibrated external phase noise measurement instrument. The two-oscillator measurement system may also allow the reference source to "slip frequency" into phase quadrature.

In one aspect of operation, for noise measurements, the reference source is programmed to the same frequency as the device under test 102a-102b. The phase/frequency locked loop slips into quadrature with the device under test 102a-102b at the phase detector inputs because the source of the PLL synthesizer device 550 uses a reference oscillator (the oscillator 564, such as a VXCO) that is fed by the output of the phase detector 516. The phase detector output (after the filter 574, such as a 20 MHz or other low-pass filter) has a power spectrum directly proportional to the total phase noise of the reference and the device under test 102a-102b. The constant of proportionality is the conversion gain of the phase detector (V/Hz), which is constant for all sideband frequencies.

For calibration, the reference source is programmed to a frequency different from the device under test 102a-102b (such as 1 MHz or some other amount) to create a beat note. The amplitude of the beat note is related to the gain of the phase detector 516 and the level of the signals at its inputs. The beat note, which may have a very large amplitude in comparison with phase noise, is measured at a point within the baseband amplification system after a relatively small gain, such as at the output of the amplifier 566 (using the appropriate setting for the switch 572). The calibrated value results from the measured beat note amplitude and the gain between the points at which the phase noise and beat note are measured. The calibrated value can be relatively independent of the DUT output level and gain prior to the point at which the beat note is measured, and the calibration technique may depend upon the phase detector 516 (such as one implemented using a double-balanced mixer) operating within its linear range.

While not shown, a second or auxiliary servo controller (such as a second servo integrator) could be used with the loop filter attached to the servo integrator 562. The auxiliary servo controller could be applied to the filter within the servo integrator 562 to give the filter the advantages of both a first-order and a second-order loop filter when used in the two-oscillator phase noise measurement system. A second-order loop filter is normally used to guarantee zero average volts at the output of the phase detector 516, which is done to convert all phase noise to baseband amplitude noise. A second-order loop filter may also place a local oscillator (the oscillator 564) completely off frequency when out of lock, whereas a first-order loop filter may place the local oscillator relatively close to the frequency of the source to be measured and also have the ability to acquire lock over a considerable frequency range. Yet a first-order loop filter may provide a phase detector average output of zero volts only at a single frequency. The auxiliary servo controller could vary an offset voltage between the output of the phase detector 516/low-pass filter 574 and the first-order loop filter to maintain zero average volts at the phase detector output. At the same time, the auxiliary servo controller could deliver the correct voltage to the input of the oscillator 564 (such as a VCXO) in order to match the frequency and properly adjust the phase of the VCO 552 relative to the carrier of the device under test 102a or 102b.

The loop filter within the servo integrator 562 may also allow lock to be acquired when the reference and device under test sources initially differ in frequency (such as by up to 25 ppm) while still maintaining 0V at the output of the phase detector 516 by using the following. The filter within the servo integrator 562 could be implemented as a switched first-order and second-order loop filter. The filter within the servo integrator 562 could rapidly change from first-order to second-order to obtain advantages of both filter types. For example, using three relay poles, the auxiliary servo integrator stage can be rearranged to (1) convert the filter 574 to a first-order loop filter by disconnecting its feedback capacitor; (2) adjust its gain to the maximum allowable and still maintain linear operation in voltage versus frequency operation and have no limiting; and (3) keep its feedback capacitor charged to the correct voltage. In this way, when second-order operation is restored, there may be no transients in its output.

As shown in FIG. 5, in some embodiments, a switch 576 can be provided on the load board 106 or on the test board 110. The switch 576 can be used to inject a particular input signal into one or more devices under test 102a-102b, thereby causing each device under test to generate an output signal that is analyzed by (among other things) the test board 110. In this example, a reference crystal oscillator signal for the device under test can come from an independent source (such as an external oscillator source or "XTAL OSC REF") or from the test board 110 itself, such as from the oscillator 564.

In these embodiments, the first-order phase locked loop allows the free running (unlocked) frequency of the oscillator 564 to be adjusted by its tuned circuit components to a nominal reference frequency, which could be within 1 ppm of the device under test's frequency. Moreover, the output voltage of the phase detector 516 that exists with no input signal (or one input signal) may be equal to the voltage that exists with both of its input signals present and at the desired (quadrature) phase relationship. As a result, a device under test and the PLL synthesizer device 550 can be programmed to the same frequency, and both may receive the same crystal oscillator reference via the switch 576.

Because of this, prior to connecting the device under test to its phase detector input (by actuating the relay 502), both the device under test and the VCO 552 may already be on the same general frequency (with small variations possible). At that time, the phase relationship between signals from the device under test and the VCO 552 is constant but unknown. When the relay 502 is actuated to connect the device under test to its phase detector input, the output voltage of the phase detector 516 may jump to the voltage that represents the current phase difference. This voltage may not instantly propagate to the oscillator 564 to throw it off frequency because of the slow acting loop filter contained within the servo integrator 562. Instead, minute and smooth frequency changes may occur in the oscillator 564, which may cause minute and smooth frequency changes to the internal synthesizer of the device under test and to the VCO 552. These changes may occur at different rates, and the proper phase relationship (quadrature at the phase detector inputs) is produced.

It is possible within the constraints of this system for the common frequency to deviate from the nominal value, but the exact common frequency may be of no consequence to the accuracy of the phase noise/phase jitter measurement. However, if the common frequency moves far enough from the nominal (free running) frequency, the first-order loop filter may cause the phase detector's output voltage to differ sufficiently from the desired value (in this case 0V). This may impair the phase relationship of the device under test and the VCO 552 at the phase detector inputs and adversely affect the measurement accuracy. In that case, the technique described above for applying an auxiliary servo controller to the loop filter (to give the filter the advantages of both a first-order and a second-order loop filter) could be employed in tandem with this technique.

This technique may help to place the reference and DUT synthesizers on the same frequency at once without the need for frequency acquisition. For example, the master crystal oscillator used to generate a signal for a device under test can be the same VCXO (oscillator 564) that locks the phase noise measurement system. As a result, the system places the reference and DUT oscillators at the same frequency and to the correct phase. This technique may also eliminate the uncertainty and maintenance associated with the use of an external crystal oscillator reference frequency in a testing facility. Note that the switch 576 still allows the external crystal oscillator reference signal to be coupled to a device under test, which may allow, for example, the tester facility's crystal oscillator reference to be reconnected while an offset beat note reference reading is being taken.

Figure 6:
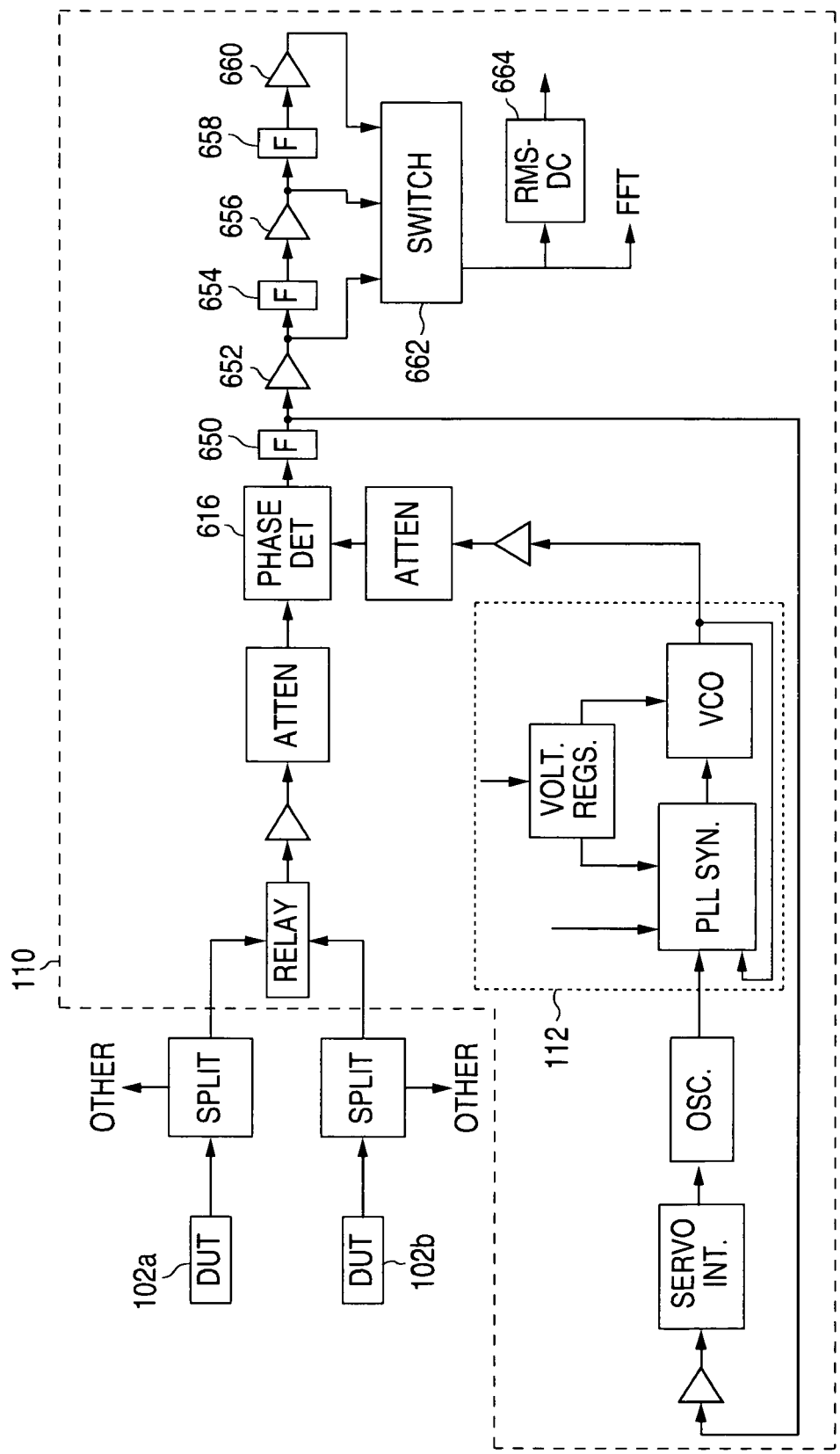

FIG. 6 illustrates another example test board 110 that implements a "two-oscillator" measurement system using a phase/frequency locked loop. As shown in FIG. 6, a phase detector 616 outputs a signal to a filter 650, such as a 20 MHz low-pass filter. An output of the filter 650 is provided to an amplifier 652, such as a low noise amplifier having a frequency range of up to 20 MHz and a voltage gain of 10 or 20. An output of the amplifier 652 is provided to a filter 654, such as a 100 Hz or 10 kHz high-pass filter. An output of the filter 654 is provided to an amplifier 656, such as an amplifier with a gain of 100. An output of the amplifier 656 is provided to a filter 658, such as a 300 kHz high-pass filter. An output of the filter 658 is provided to an amplifier 660, such as an amplifier with a gain of 30.

Signals from the amplifiers 652, 656, and 660 are provided to a switch 662, which selectively outputs one of the signals to an RMS-to-DC conversion unit 664, an FFT analyzer, and/or another destination. The amplifier 652 and the filters 654 and 658 may be adjusted to provide the desired spectral range. The conversion unit 664 may read the noise level in this spectral range and provide the measured noise level to the DUT tester 104. The FFT functionality may or may not be used in this example. In other respects, the test board 110 in FIG. 6 is similar in structure and operation to the test board 110 of FIG. 5.

Figure 7:
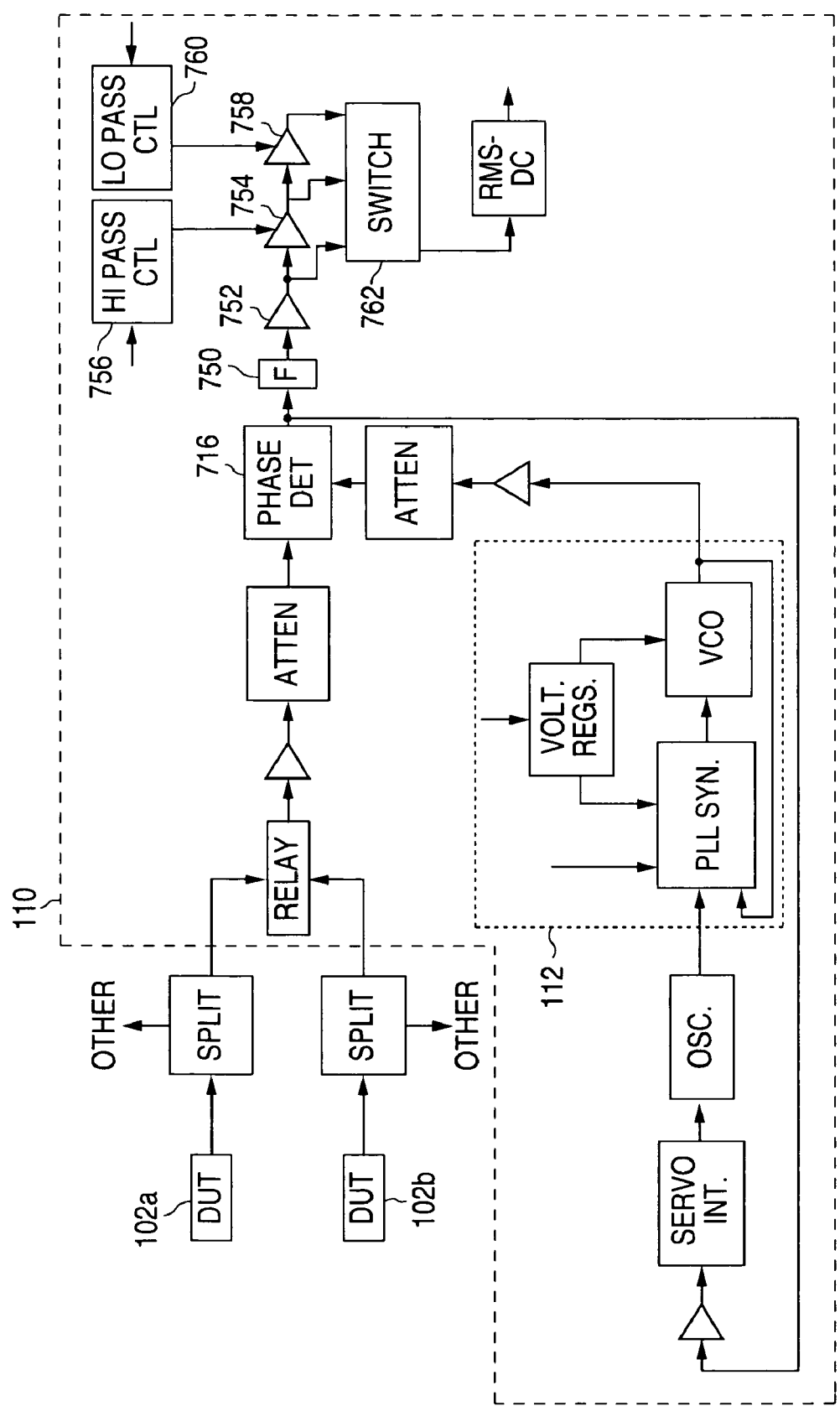

FIG. 7 illustrates yet another example test board 110 that implements a "two-oscillator" measurement system using a phase/frequency locked loop. As shown in FIG. 7, a phase detector 716 outputs a signal to a filter 750, such as a 20 MHz low-pass filter. An output of the filter 750 is provided to an amplifier 752, such as a low noise amplifier having a frequency range of up to 20 MHz and a voltage gain of 10 or 20. An output of the amplifier 752 is provided to an amplifier 754, such as an amplifier with a gain of 100. A controller 756 controls the operation of the amplifier 754. For example, the controller 756 could control high-pass filtering provided by the amplifier 754, such as by setting the high-pass filtering to be between a high-pass filtering value and 20 MHz.

An output of the amplifier 752 is provided to an amplifier 754, such as an amplifier with a gain of 31.62. A controller 756 controls the operation of the amplifier 754. For example, the controller 756 could control high-pass filtering provided by the amplifier 754, such as by setting the high-pass filtering to be between a high-pass filtering value and 10 MHz.

An output of the amplifier 754 is provided to an amplifier 758, such as an amplifier with a gain of 31.62. A controller 760 controls the operation of the amplifier 758. For example, the controller 760 could control low-pass or bandpass filtering provided by the amplifier 758, such as by setting the filtering to be from a lower value up to the high-pass filtering value provided by the controller 756.

The controllers 756 and 760 may be programmed or controlled in any suitable manner, such as by using digital control values from the DUT tester 104. This allows the high-pass filtering and the low-pass or bandpass filtering to be adjusted to a desired spectral range.

Signals from the amplifiers 752, 754, and 758 are provided to a switch 762, which selectively outputs one of the signals to a suitable destination. In other respects, the test board 110 in FIG. 7 is similar in structure and operation to the test boards 110 of FIGS. 5 and 6.

Although FIGS. 2 through 7 illustrate various examples of phase noise/phase jitter test boards 110 for use with a product tester, various changes may be made in FIGS. 2 through 7. For example, features shown in one or more of these figures could be incorporated into the test boards shown in other figures. Also, while the various circuits shown here may be used to increase or maximize signal integrity, various components can be combined or omitted and additional components could be added to the illustrated test boards 110 according to particular needs. Further, various components shown in these figures could be replaced by other components capable of performing the same or similar function(s). In addition, other test boards capable of measuring phase noise/phase jitter or other characteristics of one or more devices under test could be used in the system 100.

Figure 8A:
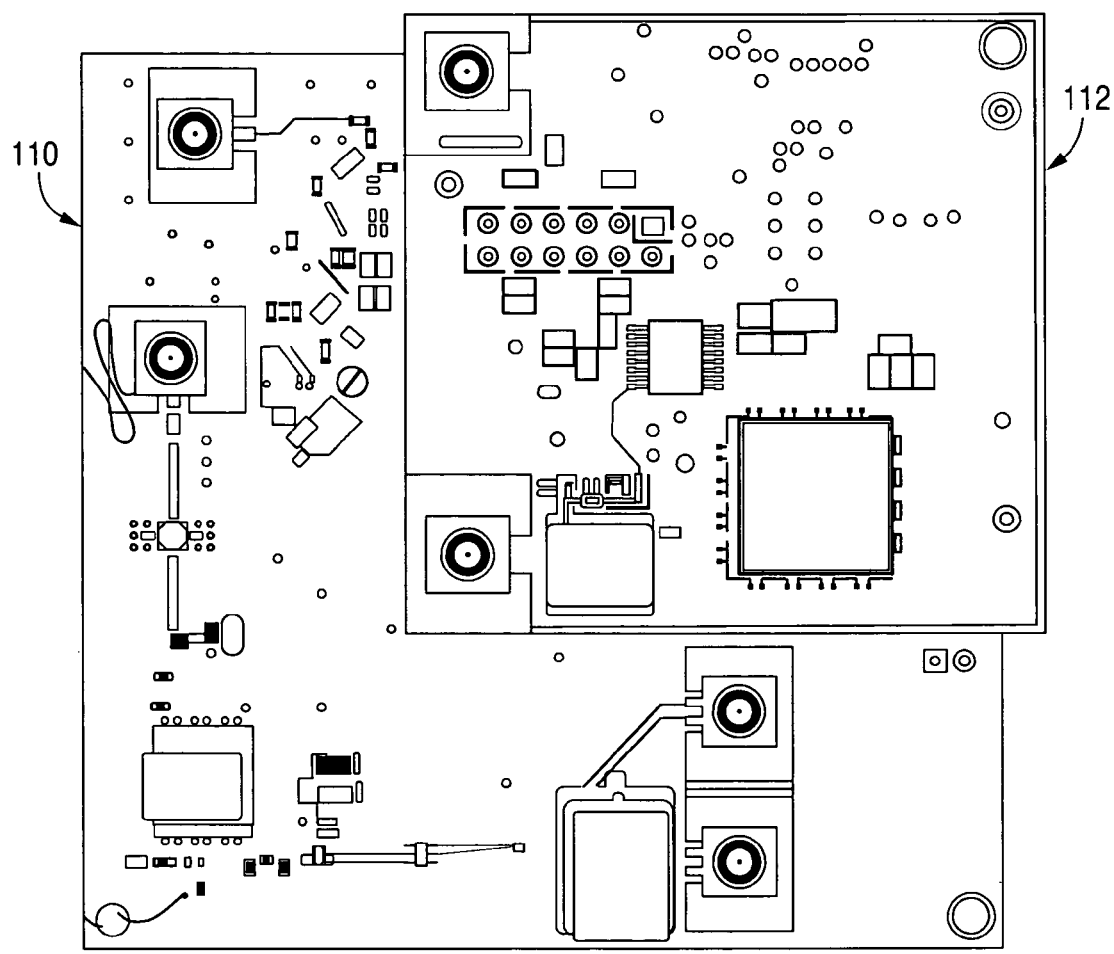
FIGS. 8A and 8B illustrate an example phase noise/phase jitter test board that has a customization module and that is mounted on a load board of a product tester according to this disclosure.
Figure 8B:
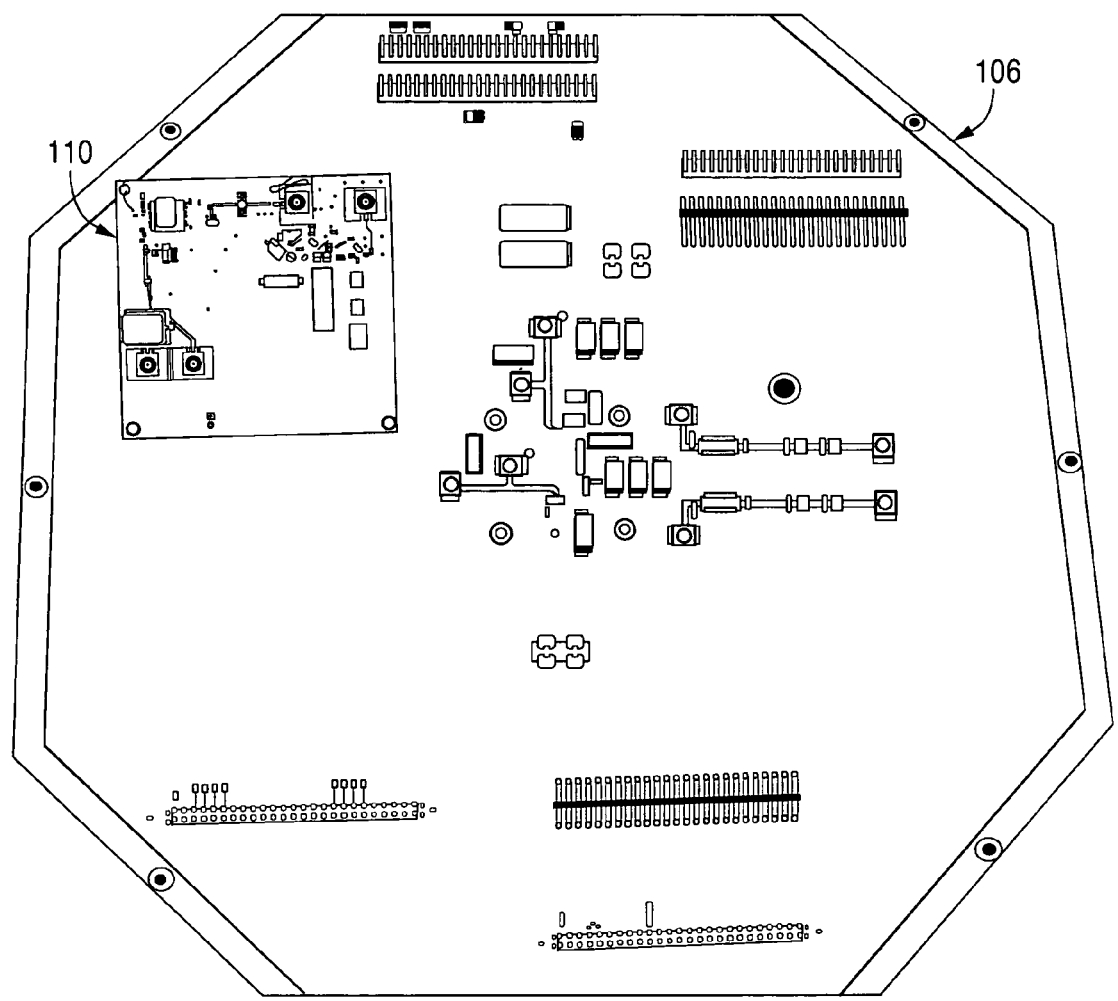

FIGS. 8A and 8B illustrate an example phase noise/phase jitter test board that has a customization module and that is mounted on a load board of a product tester according to this disclosure. The embodiments of the test board 110 and the customization module 112 shown in FIGS. 8A and 8B are for illustration only. Other embodiments of the test board 110 and the customization module 112 could be used without departing from the scope of this disclosure.

In FIG. 8A, the customization module 112 is mounted on one side of the test board 110. The test board 110 in this example includes a small printed circuit board, such as a printed circuit board that is 10 square inches or less in area. In particular embodiments, the test board 110 is three inches or less by three inches or less. Also, the customization module 112 in this example includes a smaller printed circuit board. In particular embodiments, the customization module 112 is two inches or less by two inches or less. Collectively, the test board 110 and the customization module 112 could represent circuitry that is thirteen square inches or less in total area and 250 millimeters or less in total height (when the customization module 112 is mounted on the test board 110).

As shown in FIG. 8B, the test board 110 can be mounted on the load board 106. In this example, the test board 110 is mounted on the load board 106 in a manner that hides the customization module 112. However, the test board 110 could also be mounted on the load board 106 so as to expose the customization module 112. In this particular example, the load board 106 could be about 100 square inches in area, and the test board 110 and the customization module 112 are much smaller than the load board 106. By coupling the test board 110 to the load board 106, the test board 110 is able to communicate with and test one or more devices under test 102a-102n.

Although FIGS. 8A and 8B illustrate one example of a phase noise/phase jitter test board that has a customization module and that is mounted on a load board of a product tester, various changes may be made to FIGS. 8A and 8B. For example, the test board 110, customization module 112, and load board 106 could have any suitable size, shape, and dimensions. Also, more than one test board 110 could be mounted on the load board 106, and more than one customization module 112 (or no customization modules 112) could be mounted on the test board 110.

FIGS. 9A1, 9A2, 9B1, 9B2, 9C1, 9C2, 9D1, 9D2, 9E1, 9E2, 9F1, 9F2, 9G1, 9G2, 9H1, 9H2, and 9I illustrate an example circuit layout of a phase noise/phase jitter test board 110 according to this disclosure. FIGS. 10A through 10D illustrate an example circuit layout of a phase noise/phase jitter customization module 112 according to this disclosure. The circuit layouts shown in FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D are for illustration only. The test board 110 and customization module 112 could be implemented using any other suitable circuit layouts without departing from the scope of this disclosure.

In FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D, the test board 110 and the customization module 112 are implemented using various logic. In FIGS. 9A1, 9A2, 9B1, 9B2, 9C1, 9C2, 9D1, 9D2, 9E1, 9E2, 9F1, 9F2, 9G1, 9G2, 9H1, 9H2, and 9I, the various components could be placed on any suitable side of the test board 110. For example, the components in FIGS. 9A1, 9A2, 9C1, 9C2, 9E1, 9E2, 9F1, 9F2, 9G1, 9G2, and 9I could be placed on the bottom side of the test board 110 (the exposed side in FIG. 8B). The components in FIGS. 9B1 and 9B2 could be placed on the bottom side of the test board 110 (the side in FIG. 8A on which the customization module 112 is mounted). The components in FIGS. 9H1 and 9H2 could be placed on the bottom side of the test board 110 except for the header J8, which could be placed on the top side of the test board 110. The components in FIGS. 9D1 and 9D2 could be placed on the top side of the test board 110 except for the regulator U13 (and its associated components), the resistor R87, and the capacitor C33. Also, in FIGS. 9A1, 9A2, 9B1, 9B2, 9C1, 9C2, 9D1, 9D2, 9E1, 9E2, 9F1, 9F2, 9G1, 9G2, 9H1, 9H2, and 9I, various points are denoted as "TPxx", which represent test points in the test board 110. Further, the customization module 112 may be referred to as a "reference board" in these figures.

Figure 9I:
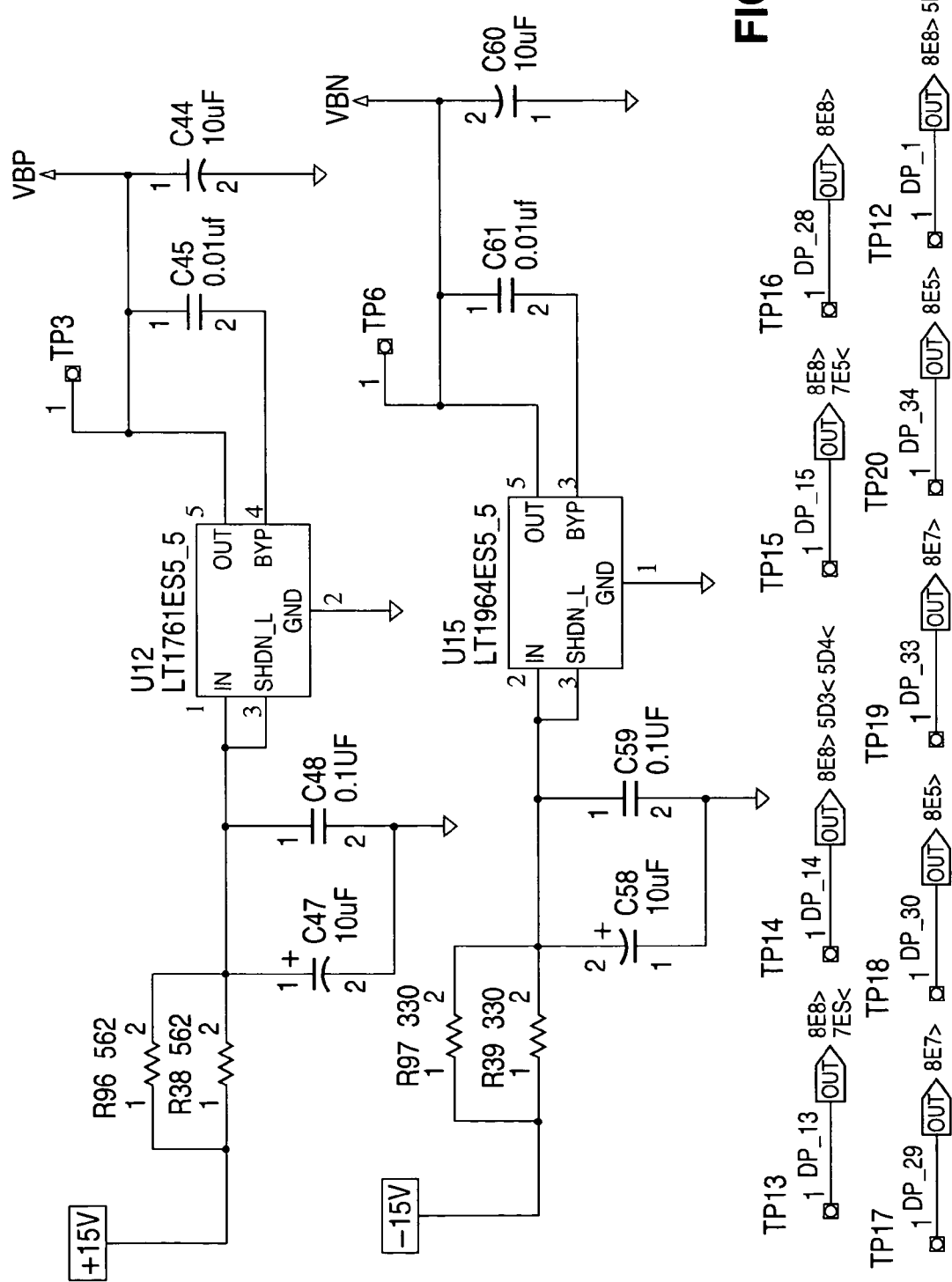
Figure 10A:
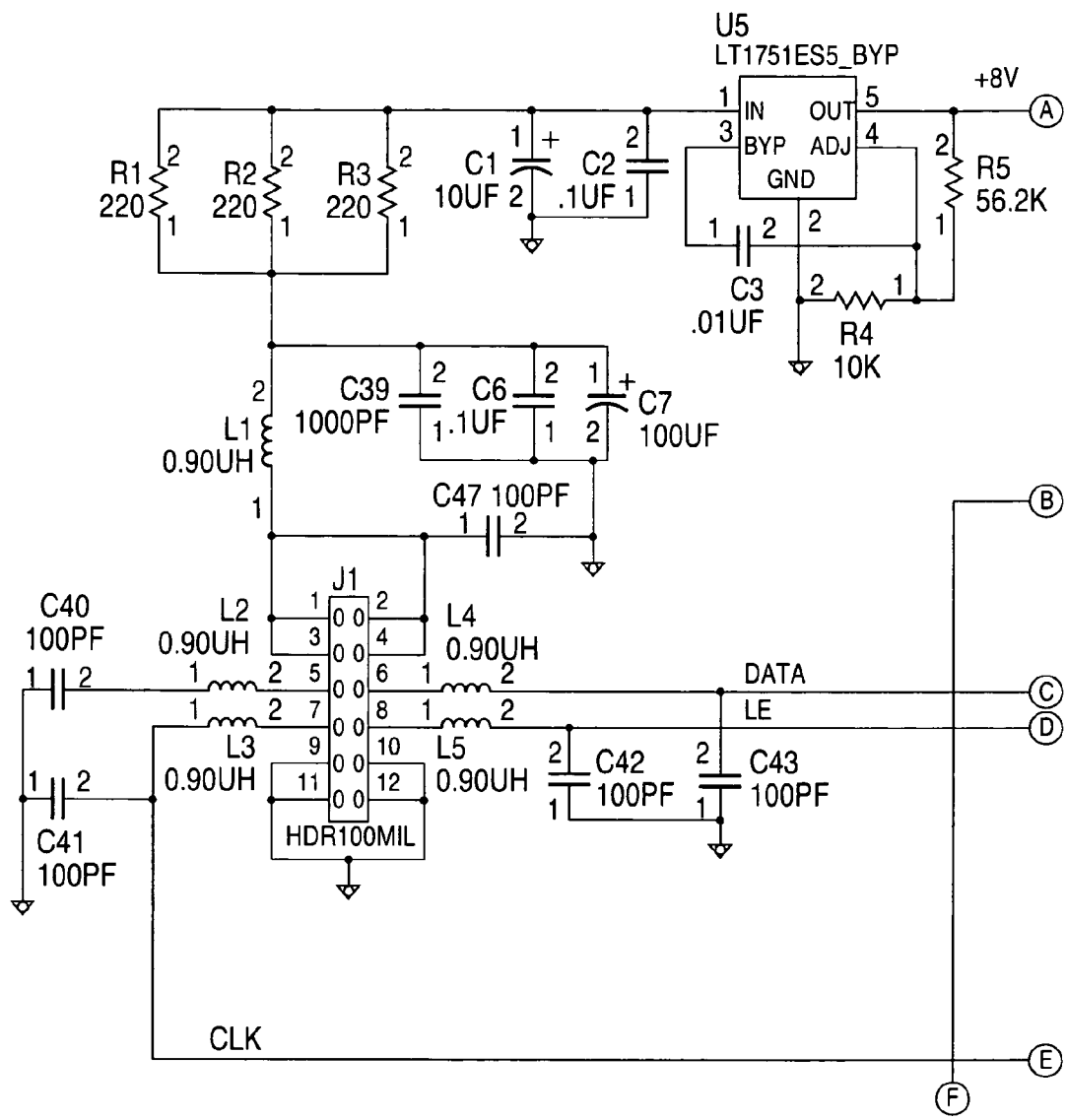
FIGS. 10A through 10b illustrate an example circuit layout of a phase noise/phase jitter customization module according to this disclosure.
Figure 10B:
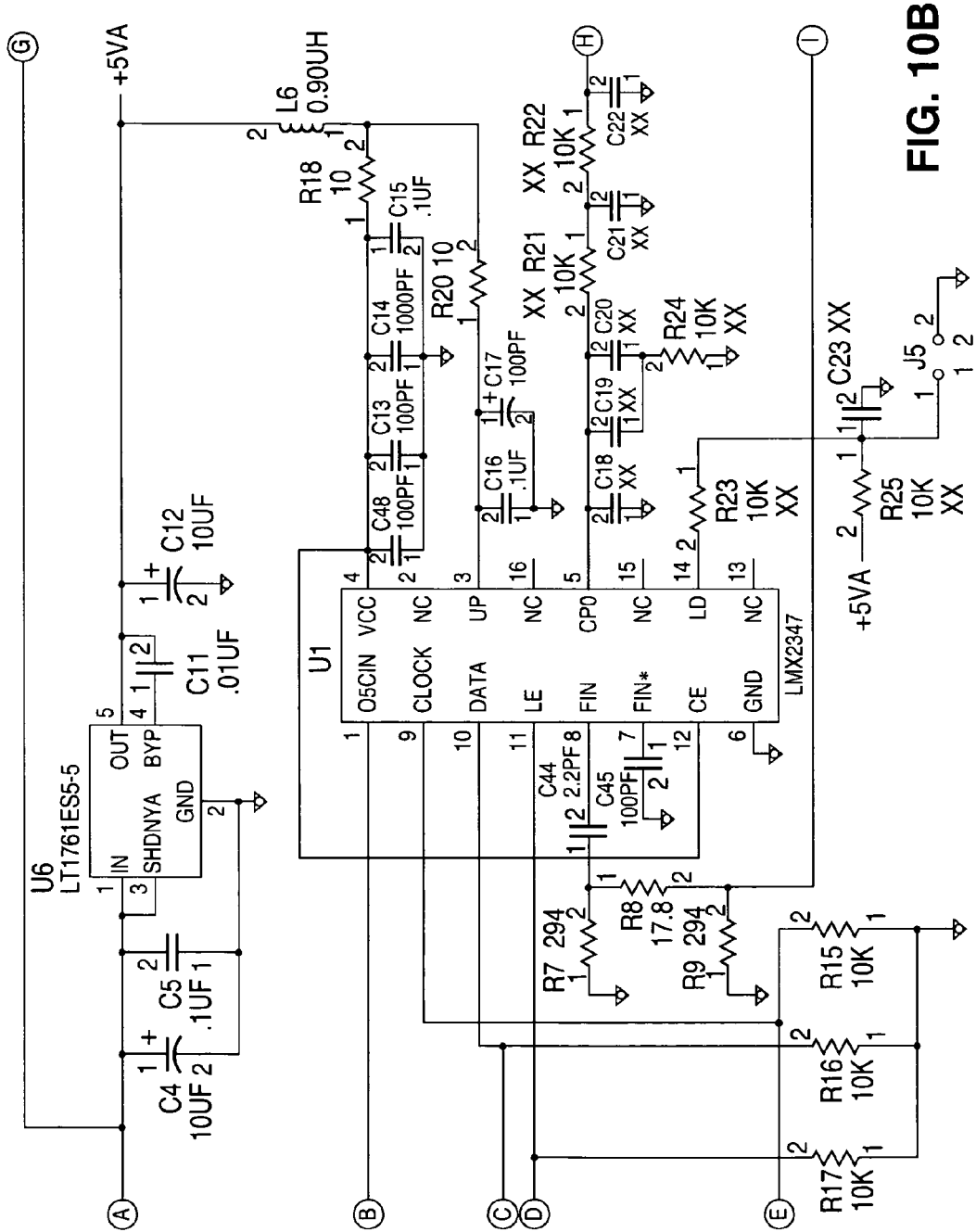
Figure 10C:
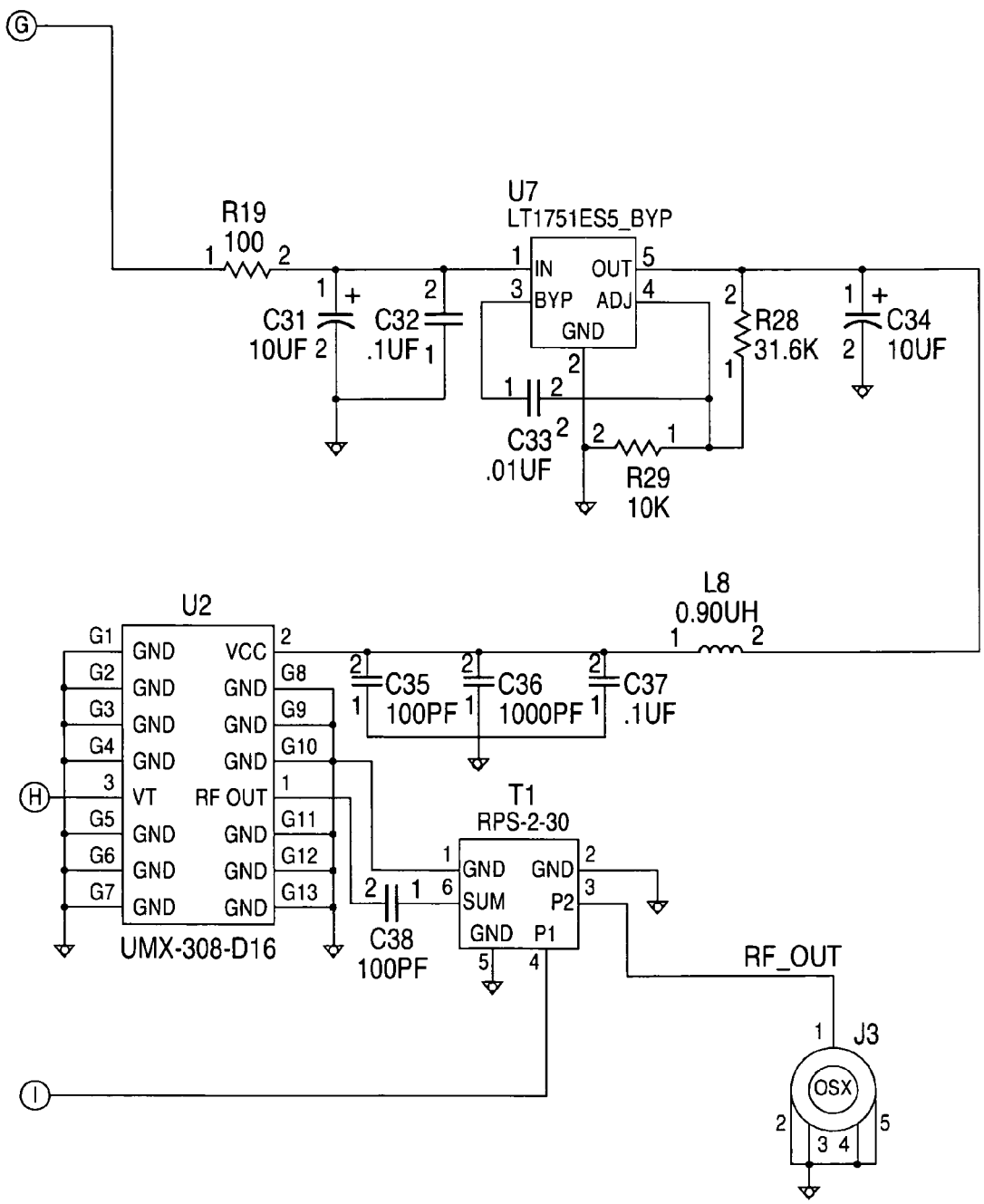
Figure 10D:
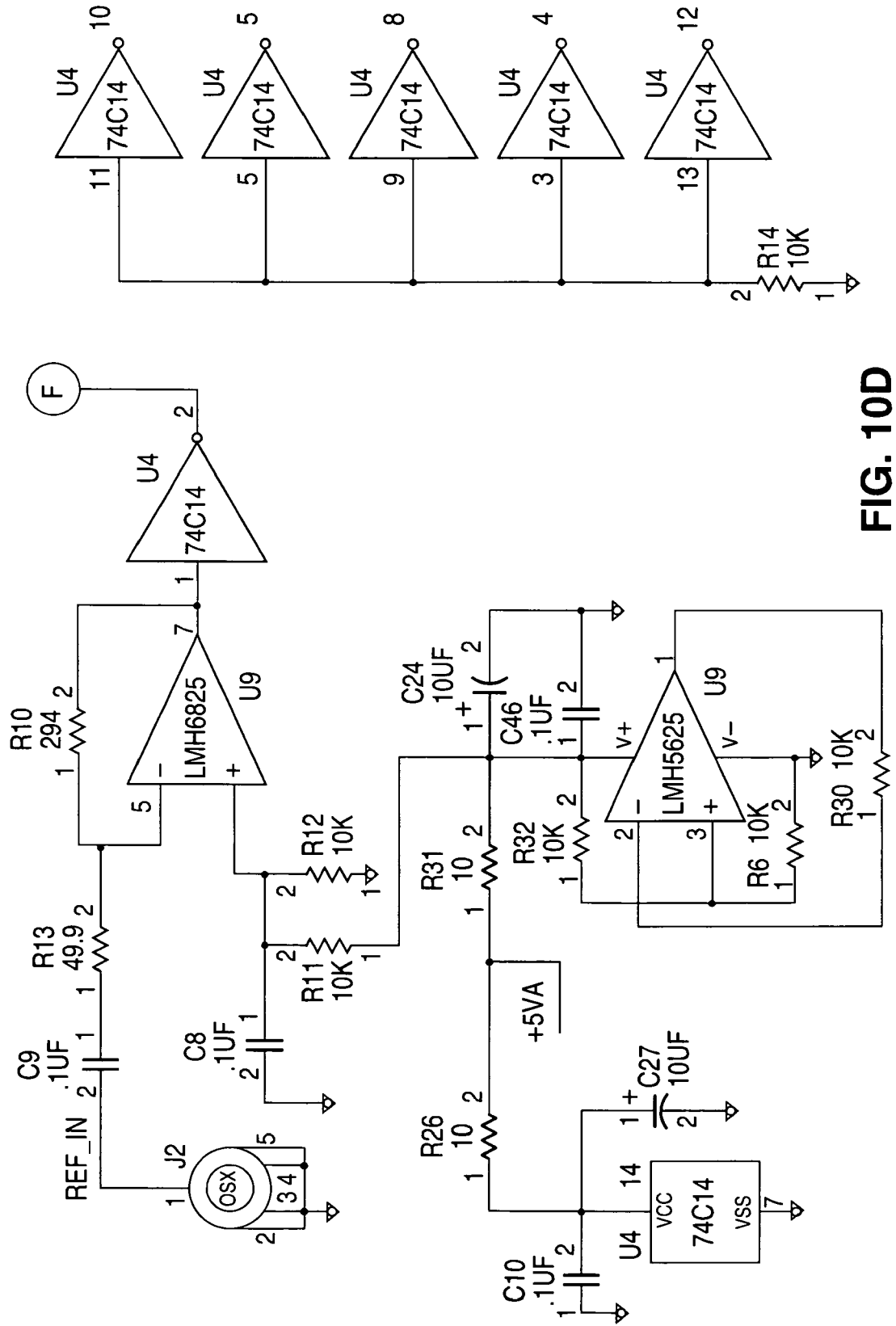

Various RF connectors are used to couple the test board 110 to the customization module 112 or to the device under test in FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D. In some embodiments, these RF connectors may represent coaxial cable connectors capable of receiving coaxial cables. Also, the impedance of the coaxial cables when viewed from the RF connectors could equal any suitable value, such as 50Ω. Also, FIGS. 9E1 and 9E2 illustrate a discrete preamplifier section of the test board 110, which includes the operational amplifier U16. Among other things, the discrete preamplifier section may help provide a better measurement system noise figure over many octaves and at a 50Ω impedance level. In comparison, operational amplifiers may provide this noise figure, but at impedance levels only down to a few hundred Ohms.

Although FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D illustrate one example of a circuit layout of a test board 110 and one example of a circuit layout of a customization module 112, various changes may be made to FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D. For example, the particular values of components shown in FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D are for illustration only. Various resistors, capacitors, and inductors could have any suitable resistances, capacitances, and inductances according to particular needs. Also, particular component numbers are provided for various components, such as operational amplifiers, switches, voltage regulators, transistors, and other components in the test board 110 and customization module 112. Any other suitable components could be used in the test board 110 and customization module 112. In addition, the logic shown in FIGS. 9A1, 9A2, 9B1, 9B2, 9C1, 9C2, 9D1, 9D2, 9E1, 9E2, 9F1, 9F2, 9G1, 9G2, 9H1, 9H2, 9I, 10A, 10B, 10C, and 10D could be replaced by other components capable of performing the same or similar function(s).

Figure 11:
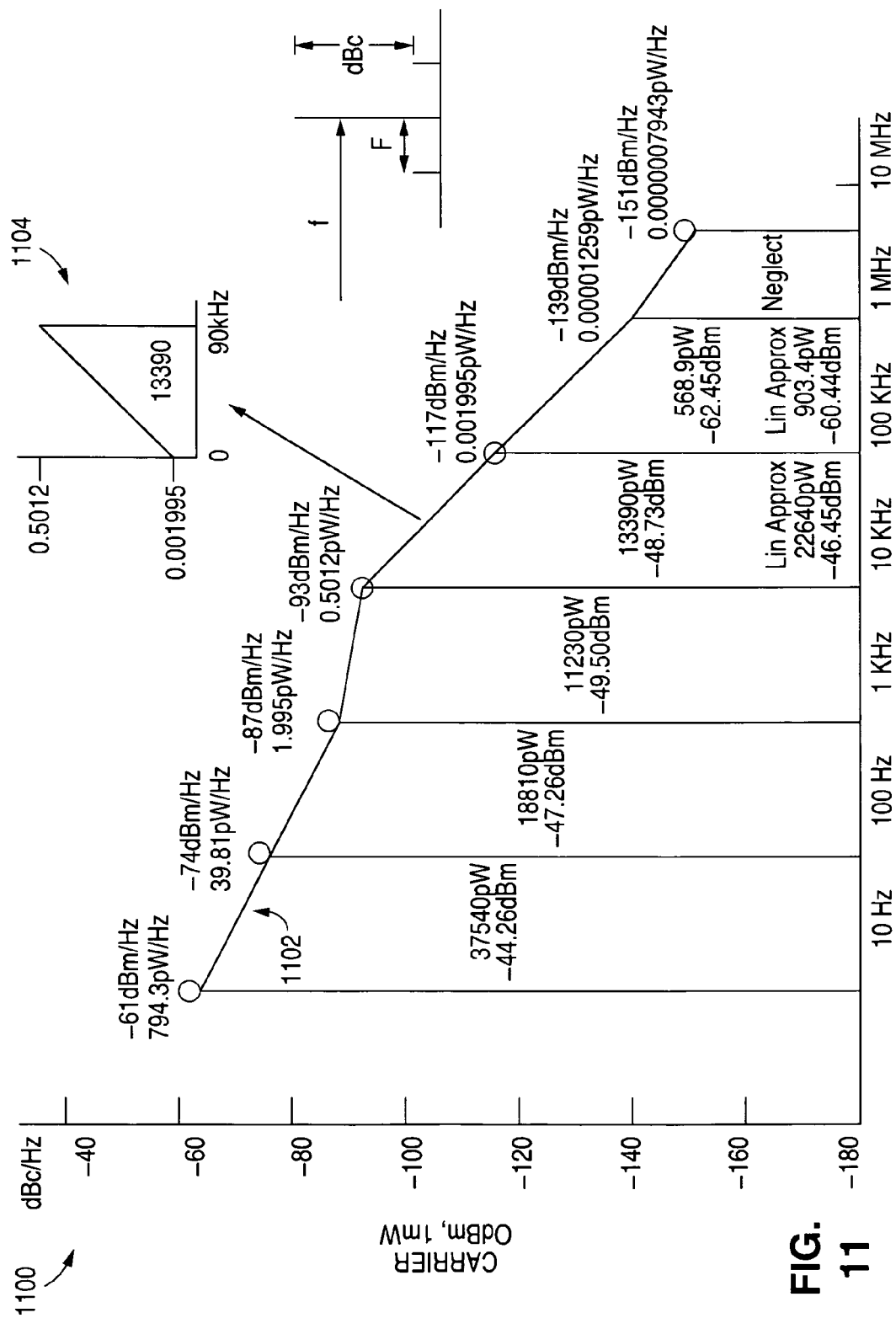
FIG. 11 illustrates an example technique for measuring phase noise/phase jitter according to this disclosure.

FIG. 11 illustrates an example technique for measuring phase noise/phase jitter according to this disclosure. The technique shown in FIG. 11 could, for example, be used by the DUT tester 104 or other component based on measurements obtained by the test board 110. The technique for measuring phase noise/phase jitter shown in FIG. 11 is for illustration only. Other techniques for measuring phase noise/phase jitter could be used without departing from the scope of this disclosure.

In this example technique, single sideband (SSB) measurements may be taken by the test board 110, and these measurements can be used to calculate RMS timing noise/jitter. As shown here, a plot 1100 includes a phase noise sideband curve 1102. The phase noise sideband curve 1102 could be based on any suitable data, such as data collected by the test board 110. In this example, the phase noise sideband curve 1102 is divided into individual segments that collectively form the curve 1102.

To calculate phase noise/phase jitter, a piecewise integration can be performed over a desired offset frequency range F. This allows the total sideband power to be obtained. This could include, for example, performing an integration over one or more of the segments in the phase noise sideband curve 1102. All of the segments in the phase noise sideband curve 1102 can be selected to measure the total sideband power, or individual segments or portions of segments can be selected to measure the sideband power in a narrower frequency range.

The total sideband power value can then be used to calculate the phase noise/jitter. For example, using the simple formula from small index phase modulation theory, RMS sideband voltage measurements can be converted into RMS jitter measurements in radians (Vsb/Vcar). The RMS jitter measurements in radians can then be converted into measurements in seconds (time) by dividing the radian measurements by the angular frequency of the carrier.

Consider, for example, the phase noise sideband curve 1102 shown in FIG. 11. At 10 kHz, the measured sideband power is −93 dBm/Hz or 0.5012 pW/Hz. At 100 kHz, the measured sideband power is −117 dBm/Hz or 0.001995 pW/Hz. A "power law" value can be obtained using the formula (117−93)/(100 kHz/10 kHz)=(24/10)=2.4. Then, the relevant segment(s) of the phase noise sideband curve 1102 can be translated to a zero frequency and reflected around the power density axis. This could produce a modified segment 1104 as shown in FIG. 11. This modified segment 1104 can then be fit to a curve $p=AF^{2.4}+B$ (here, 2.4 represents the computed power law, $B=0.001995$, $p=0.5012$, and $F=90$ kHz). Solving for A could therefore yield $A=6.428311\ E^{-13}$. Thus, the curve equation can be rewritten as $p=6.428311\ E^{-13}F^{2.4}+0.001995$. Integrating p over the desired range may yield $P=\text{Int}(P\ dF)=1.890680\ E^{-13}F^{3.4}+0.001995\ F$ (integrated over 0-90 kHz), producing a value P=13394. This represents the total power in picowatts for the selected 10 kHz-100 kHz range, and it can be used to compute the RMS jitter in radians (which is then converted into seconds).

In other embodiments, a different technique could be used to measure phase noise/jitter. For example, when the carrier signal represents a 1 mW or lower carrier, dBc figures can be used as dBm figures in a specified frequency range. The total sideband power in the specified frequency range can be computed (such as using the technique described above) and expressed as dBc or dBm. The following equation could then be applied:

$$\text{RMS Jitter (seconds)} = \sqrt{2 \times 10^{(dBc/10)}}/2\pi f \qquad ((2)$$

where f represents the carrier frequency. This equation converts the RMS sideband power into a phase jitter measurement in seconds.

In this example, the technique shown in FIG. 11 illustrates piecewise integration, which may be needed, for example, when FFT is used. However, one of the benefits that can be obtained using various circuits described above is that quicker measurements can be obtained since the integration can be done in one step. This could be accomplished, for example, using analog low-pass and high-pass filters to include all of the noise within the specified offset band and feed it to a conversion unit (such as an RMS-to-DC converter).

It may be noted that various circuits shown above may provide greater speed during the phase noise/jitter measurements by taking measurements of the entire desired baseband spectrum at once, which can be facilitated using high-pass and low-pass bracketing filters. The band-limited signal can then be fed to an RMS-to-DC conversion unit on the test board 110 and thereafter to a simple DC voltmeter in the DUT tester 104 or elsewhere. This may be much faster and/or more accurate than using an FFT instrument on the DUT tester 104 or elsewhere to perform piecewise integration.

Although FIG. 11 illustrates one example of a technique for measuring phase noise/phase jitter, various changes may be made to FIG. 11. For example, the plot 1100 and its associated values are for illustration only. Also, any other suitable technique could be used to measure phase noise/phase jitter.

Figure 12:
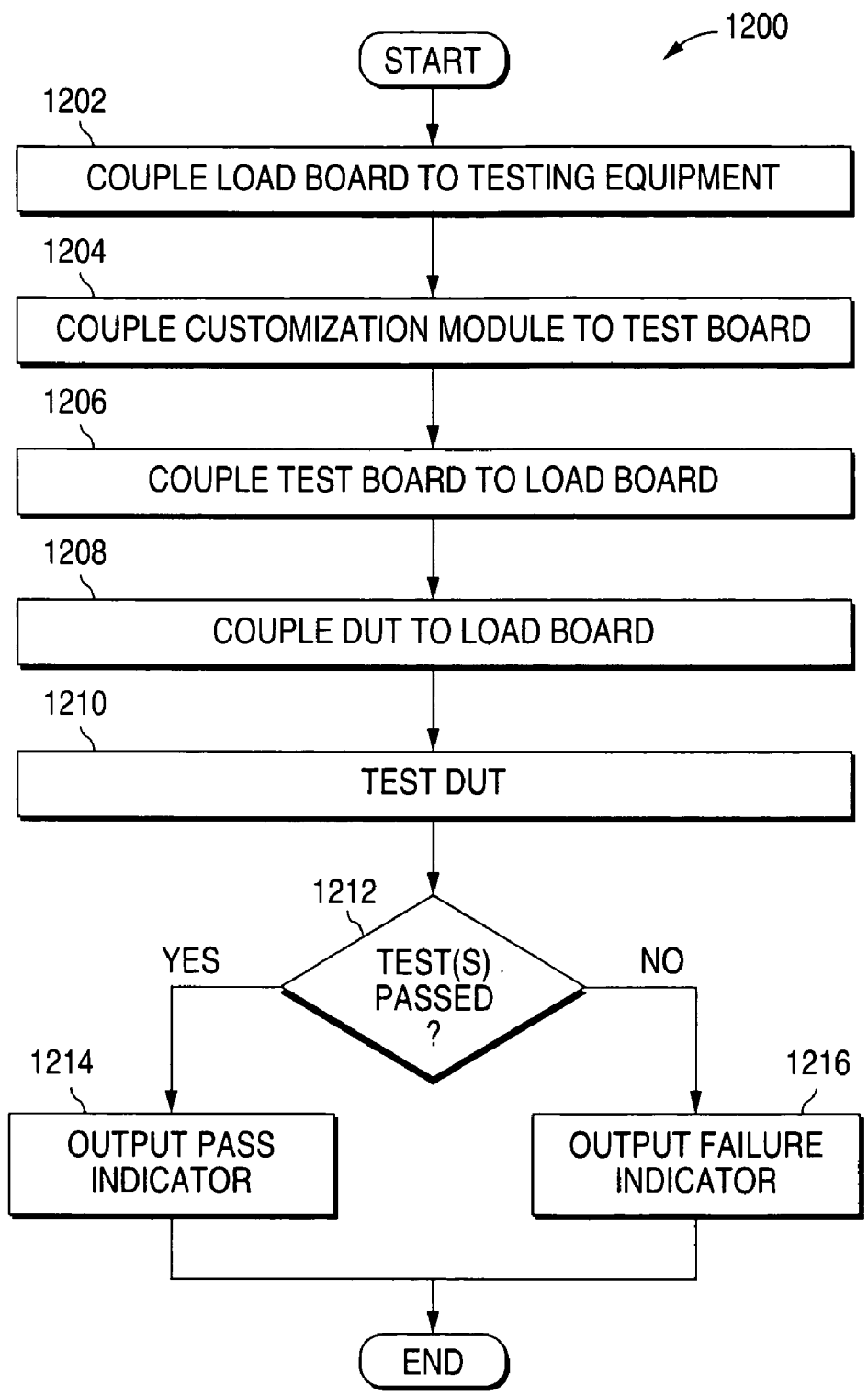
FIG. 12 illustrates an example method for measuring phase noise/phase jitter in devices under test according to this disclosure.

FIG. 12 illustrates an example method 1200 for measuring phase noise/phase jitter in devices under test according to this disclosure. The embodiment of the method 1200 shown in FIG. 12 is for illustration only. Other embodiments of the method 1200 could be used without departing from the scope of this disclosure.

A load board is coupled to testing equipment at step 1202. This could include, for example, a user coupling the load board 106 to the DUT tester 104. The load board 106 could represent a board particularly designed for one or more types of devices under test 102a-102n. The appropriate load board 106 could therefore be selected from a group of load boards based on the type of device about to be tested. The load board 106 could also represent a board designed for use with numerous types of devices under test 102a-102n.

A customization module is coupled to a test board at step 1204. This could include, for example, the user coupling the customization module 112 to the test board 110. The customization module 112 could represent a module particularly designed for one or more types of devices under test 102a-102n, and the test board 110 could represent a board capable of use with multiple types of devices under test 102a-102n. The appropriate customization module 112 could therefore be selected from a group of customization modules based on the type of device about to be tested.

The test board is coupled to the load board at step 1206. This could include, for example, the user coupling the test board 110 to the load board 106. In this way, the appropriate load board 106 for one or more types of devices under test 102a-102n can be selected, and the test board 110 can be customized to the one or more types of devices under test 102a-102n.

One or more devices under test are coupled to the load board at step 1208. This could include, for example, coupling one or more devices under test 102a-102n to the load board 106. This may place the devices under test 102a-102n in electrical connection with the test board 110.

The one or more devices are tested at step 1210. This could include, for example, the test board 110 providing signals to and receiving signals from the devices under test 102a-102n. The signals from the devices under test 102a-102n could be used to generate measurements allowing phase noise/phase jitter in the devices under test 102a-102n to be measured (such as by the DUT tester 104). As part of this testing, the DUT tester 104 or other component could compare the amount of phase noise/phase jitter identified in the devices under test 102a-102n to desired or required values or ranges and determine whether the measured phase noise/phase jitter is acceptable.

A decision is made as to whether each device under test passes or fails the testing at step 1212. Pass indicators could be provided for each passing device at step 1214, and failure indicators could be provided for each failing device at step 1216. The pass and fail indicators could be used in any suitable manner. For example, the indicators could be used to route the devices under test 102a-102n to appropriate destinations, such as to a next processing or manufacturing step, to personnel for examination, or to a disposal unit.

Although FIG. 12 illustrates one example of a method 1200 for measuring phase noise/phase jitter in devices under test, various changes may be made to FIG. 12. For example, the use of the customization module 112 is optional. Also, while shown as a series of steps, various steps in FIG. 12 could overlap, occur in parallel, occur in a different order, or occur multiple times.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller or control system may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of the invention, as defined by the following claims.

What is claimed is:

1. A system comprising:
   a device interface board configured to transport signals between a product tester and a device under test; and
   a test board coupled to the device interface board, the test board configured to receive a signal from the device under test through the device interface board, the test board also configured to generate one or more measurements associated with at least one characteristic of the device under test, the test board comprising:
   a phase detector configured to detect a phase difference between two signals, at least one of the two signals based on the signal from the device under test; and
   a control loop configured to adjust at least one of the two signals to maintain an average of approximately zero direct current volts at an output of the phase detector.

2. The system of claim 1, wherein the test board is configured to generate one or more measurements associated with phase noise or phase jitter in the device under test.

3. The system of claim 1, wherein:
   the test board further comprises a phase-locked loop synthesizer configured to generate a reference signal;
   the phase detector is configured to detect a phase difference between the reference signal and the signal from the device under test; and
   the control loop is configured to adjust the phase-locked loop synthesizer to maintain the average of approximately zero direct current volts at the output of the phase detector.

4. The system of claim 1, wherein:
   the test board further comprises:
   a splitter configured to split the signal from the device under test to produce first and second split signals;
   a delay line configured to delay the first split signal; and
   a phase shifter configured to shift a phase of the second split signal;
   the phase detector is configured to detect a phase difference between the delayed first split signal and the shifted second split signal; and
   the control loop is configured to adjust the phase shifter to maintain the average of approximately zero direct current volts at the output of the phase detector.

5. The system of claim 1, wherein:
   the test board further comprises:
   a phase-locked loop synthesizer configured to generate a reference signal, the reference signal for controlling a first oscillator; and
   a second oscillator configured to generate an input signal for the phase-locked loop synthesizer;
   the phase detector is configured to detect a phase difference between the signal from the device under test and a signal from the first oscillator; and
   the control loop is configured to adjust the second oscillator to maintain the average of approximately zero direct current volts at the output of the phase detector.

6. The system of claim 1, further comprising:
   a customization module coupled to the test board, the customization module configured to generate one or more signals used to generate the one or more measurements.

7. A system comprising:
   a device interface board configured to transport signals between a product tester and a device under test; and
   a test board coupled to the device interface board, the test board configured to receive a signal from the device under test through the device interface board, the test board also configured to generate one or more measurements associated with at least one characteristic of the device under test, the test board comprising:
a phase detector configured to detect a phase difference between two signals, at least one of the two signals based on the signal from the device under test;
a plurality of amplifiers, a first of the amplifiers configured to receive and amplify an output of the phase detector, one or more remaining amplifiers configured to receive and amplify an output of a prior amplifier; and
a switch configured to selectively output one of multiple signals received from the plurality of amplifiers.

8. The system of claim 7, wherein the test board further comprises:
a conversion unit configured to convert root mean square values into direct current values, the root mean square values based on the signals provided by the switch.

9. A system comprising:
a device interface board configured to transport signals between a product tester and a device under test;
a test board coupled to the device interface board, the test board configured to receive a signal from the device under test through the device interface board, the test board also configured to generate one or more measurements associated with at least one characteristic of the device under test; and
a customization module coupled to the test board, the customization module configured to generate one or more signals used to generate the one or more measurements, the customization module comprising at least one of: a phase shifter, a phase-locked loop synthesizer, and an oscillator.

10. An apparatus comprising:
an interface configured to communicate with a device under test through a device interface board; and
circuitry configured to receive a signal from the device under test through the device interface board and to generate one or more measurements associated with at least one characteristic of the device under test, the circuitry comprising:
a phase detector configured to detect a phase difference between two signals, at least one of the two signals based on the signal from the device under test; and
a control loop configured to adjust at least one of the two signals to maintain an average of approximately zero direct current volts at an output of the phase detector.

11. The apparatus of claim 10, wherein the circuitry is configured to generate one or more measurements associated with phase noise or phase jitter in the device under test.

12. The apparatus of claim 10, wherein the circuitry further comprises:
a conversion unit configured to convert root mean square values into direct current values.

13. The apparatus of claim 10, wherein;
the circuitry further comprises a phase-locked loop synthesizer configured to generate a reference signal;
the phase detector is configured to detect a phase difference between the reference signal and the signal from the device under test; and
the control loop is configured to adjust the phase-locked loop synthesizer to maintain the average of approximately zero direct current volts at the output of the phase detector.

14. The apparatus of claim 10, wherein:
the circuitry further comprises:
a splitter configured to split the signal from the device under test to produce first and second split signals;
a delay line configured to delay the first split signal; and
a phase shifter configured to shift a phase of the second split signal;
the phase detector is configured to detect a phase difference between the delayed first split signal and the shifted second split signal; and
the control loop is configured to adjust the phase shifter to maintain the average of approximately zero direct current volts at the output of the phase detector.

15. The apparatus of claim 10, wherein;
the circuitry further comprises:
a phase-locked loop synthesizer configured to generate a reference signal, the reference signal for controlling a first oscillator; and
a second oscillator configured to generate an input signal for the phase-locked loop synthesizer;
the phase detector is configured to detect a phase difference between the signal from the device under test and a signal from the first oscillator; and
the control loop is configured to adjust the second oscillator to maintain the average of approximately zero direct current volts at the output of the phase detector.

16. An apparatus comprising:
an interface configured to communicate with a device under test through a device interface board; and
circuitry configured to receive a signal from the device under test through the device interface board and to generate one or more measurements associated with at least one characteristic of the device under test, the circuitry comprising:
a phase detector configured to detect a phase difference between two signals, at least one of the two signals based on the signal from the device under test;
a plurality of amplifiers, a first of the amplifiers configured to receive and amplify an output of the phase detector, one or more remaining amplifiers configured to receive and amplify an output of a prior amplifier; and
a switch configured to selectively output one of multiple signals received from the plurality of amplifiers.

17. The apparatus of claim 10, further comprising:
a customization module configured to provide one or more signals to the test board, the customization module comprising at least one of: a phase shifter, a phase-locked loop synthesizer, and an oscillator.

18. A method comprising:
coupling a test board to a device interface board of a product tester, the device interface board configured to transport signals between the product tester and a device under test;
receiving a signal from the device under test at the test board; and
generating one or more measurements associated with phase noise or phase jitter in the device under test using the signal from the device under test;
wherein the test board comprises:
a phase detector configured to detect a phase difference between two signals, at least one of the two signals based on the signal from the device under test; and
a control loop configured to adjust at least one of the two signals to maintain an average of approximately zero direct current volts at an output of the phase detector.

19. The method of claim 18, further comprising:
coupling a customization module to the test board; and providing one or more signals to the test board from the customization module for use in generating the one or more measurements, the customization module comprising at least one of: a phase shifter, a phase-locked loop synthesizer, and an oscillator.

20. The method of claim 18, wherein the test board further comprises a conversion unit that converts root mean square values into direct current values.

* * * * *